(12) United States Patent
Greenlee et al.

(10) Patent No.: US 11,894,305 B2
(45) Date of Patent: Feb. 6, 2024

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventors: Jordan D. Greenlee, Boise, ID (US); John D. Hopkins, Meridian, ID (US); Rita J. Klein, Boise, ID (US); Everett A. McTeer, Eagle, ID (US); Lifang Xu, Boise, ID (US); Daniel Billingsley, Meridian, ID (US); Collin Howder, Boise, ID (US)

( * ) Notice: Subject to any disclaimer, the term of this patent is extended or adjusted under 35 U.S.C. 154(b) by 0 days.

(21) Appl. No.: 17/658,907

(22) Filed: Apr. 12, 2022

(65) Prior Publication Data

US 2022/0238444 A1    Jul. 28, 2022

Related U.S. Application Data

(63) Continuation of application No. 16/817,267, filed on Mar. 12, 2020, now Pat. No. 11,315,877.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/53257* (2013.01);
(Continued)

(58) Field of Classification Search
CPC ............... H01L 23/535; H01L 23/5226; H01L 23/5283; H01L 23/53257; H01L 21/76805; H01L 21/76816; H01L 21/76877; H01L 21/76895; H01L 21/76886; H01L 21/76885; H10B 41/27; H10B 41/35; H10B 43/27; H10B 43/35; H10B 41/20; H10B 41/50; H10B 43/20; H10B 43/50
See application file for complete search history.

(56) References Cited

U.S. PATENT DOCUMENTS

| | | |
|---|---|---|
| 4,540,607 A | 9/1985 | Tsao |
| 4,617,087 A | 10/1986 | Iyer et al. |

(Continued)

*Primary Examiner* — Shahed Ahmed
*Assistant Examiner* — Vicki B. Booker
(74) *Attorney, Agent, or Firm* — TraskBritt

(57) ABSTRACT

A microelectronic device includes a stack structure, a staircase structure, conductive pad structures, and conductive contact structures. The stack structure includes vertically alternating conductive structures and insulating structures arranged in tiers. Each of the tiers individually includes one of the conductive structures and one of the insulating structures. The staircase structure has steps made up of edges of at least some of the tiers of the stack structure. The conductive pad structures are on the steps of the staircase structure and include beta phase tungsten. The conductive contact structures are on the conductive pad structures. Memory devices, electronic systems, and methods of forming microelectronic devices are also described.

19 Claims, 16 Drawing Sheets

(51) Int. Cl.
*H01L 23/528* (2006.01)
*H01L 23/532* (2006.01)
*H01L 23/522* (2006.01)
*H10B 41/27* (2023.01)
*H10B 41/35* (2023.01)
*H10B 43/27* (2023.01)
*H10B 43/35* (2023.01)

(52) U.S. Cl.
CPC ............. *H10B 41/27* (2023.02); *H10B 41/35* (2023.02); *H10B 43/27* (2023.02); *H10B 43/35* (2023.02)

(56) References Cited

U.S. PATENT DOCUMENTS

| | | |
|---|---|---|
| 4,751,101 A | 6/1988 | Joshi |
| 5,227,336 A | 7/1993 | Hirano et al. |
| 5,770,520 A | 6/1998 | Zhao et al. |
| 6,143,362 A | 11/2000 | Sandhu et al. |
| 6,303,480 B1 | 10/2001 | Desai et al. |
| 8,304,348 B2 | 11/2012 | Hashimoto |
| 9,343,452 B2 | 5/2016 | Yun et al. |
| 10,510,805 B2 | 12/2019 | Chan et al. |
| 2003/0194858 A1 | 10/2003 | Ee et al. |
| 2009/0142925 A1 | 6/2009 | Ha et al. |
| 2015/0270165 A1* | 9/2015 | Hyun .................... H10B 43/35 257/329 |
| 2017/0263455 A1 | 9/2017 | Watanabe et al. |
| 2019/0363014 A1* | 11/2019 | Lee ........................ H10B 43/50 |

* cited by examiner

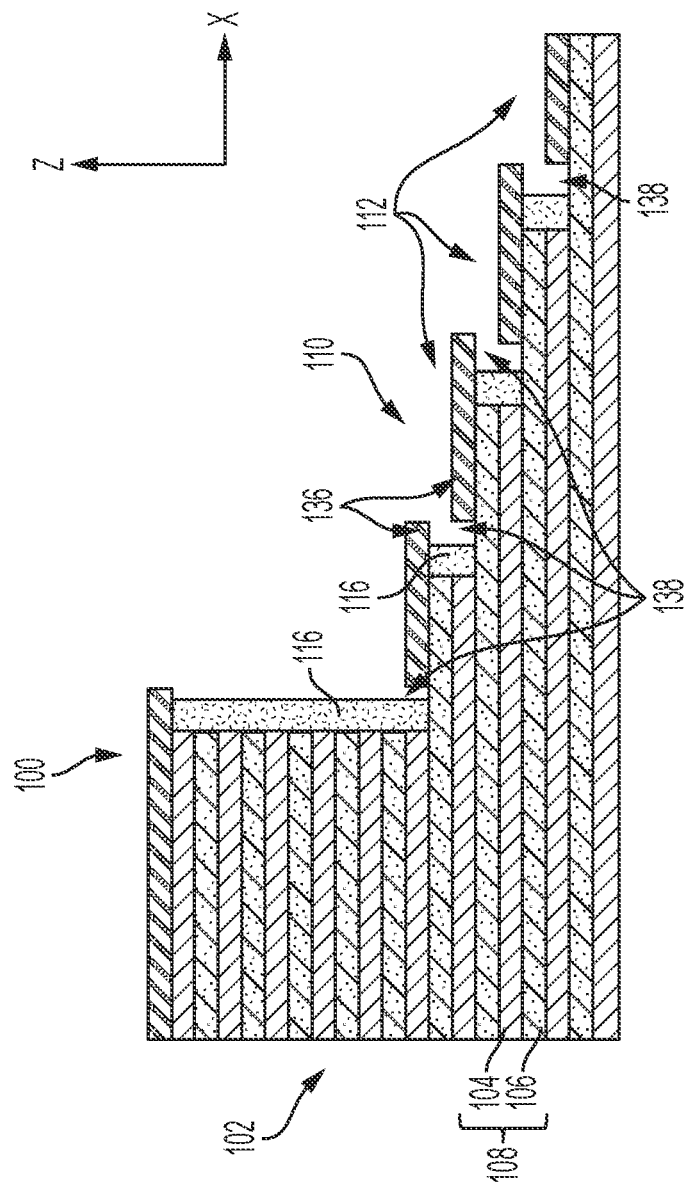

MICROELECTRONIC DEVICES INCLUDING STAIRCASE STRUCTURES, AND RELATED MEMORY DEVICES AND ELECTRONIC SYSTEMS

CROSS-REFERENCE TO RELATED APPLICATION

This application is a continuation of U.S. patent application Ser. No. 16/817,267, filed Mar. 12, 2020, now U.S. Pat. No. 11,315,877, issued Apr. 26, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., NAND Flash memory devices) have resulted in undesirable damage that can diminish desired memory device performance, reliability, and durability. For example, conventional processes of forming conductive contact structures on the steps of a staircase structure within a stack structure may punch through conductive structures of the stack structure, resulting in undesirable current leaks and short circuits. Conventional methods of mitigating such punch through include forming dielectric pad structures (e.g., so called "mesa nitride" structures) on sacrificial insulative structures (e.g., dielectric nitride structures) at steps of a staircase structure within a preliminary stack structure prior to subjecting the preliminary stack structure to so called "replacement gate" or "gate last" processing to replace one or more portions of the sacrificial insulative structures with conductive structures and form the stack structure. During the replacement gate processing the dielectric pad structures are also replaced with conductive material to effectively increase thicknesses of portions of the conductive structures at the steps of the staircase structure and mitigate the aforementioned punch through during the subsequent formation of the conductive contact structures. However, the configurations of some staircase structures (e.g., symmetric staircase structures) within a preliminary stack structure may result in incomplete replacement of the dielectric pad structures with conductive material during replacement gate processing and effectuate undesirable defects (e.g., material inconsistencies, voiding) at the steps of the staircase structure.

Accordingly, there remains a need for new microelectronic device (e.g., memory device, such as 3D NAND Flash memory device) configurations facilitating enhanced memory density while alleviating the problems of conventional microelectronic device configurations, as well as for new methods of forming the microelectronic devices and new electronic systems including the new microelectronic device configurations.

BRIEF DESCRIPTION OF THE DRAWINGS

FIGS. 1A through 1K are partial cross-sectional views illustrating a method of forming a microelectronic device, in accordance with embodiments of the disclosure.

DETAILED DESCRIPTION

Figure 1A:
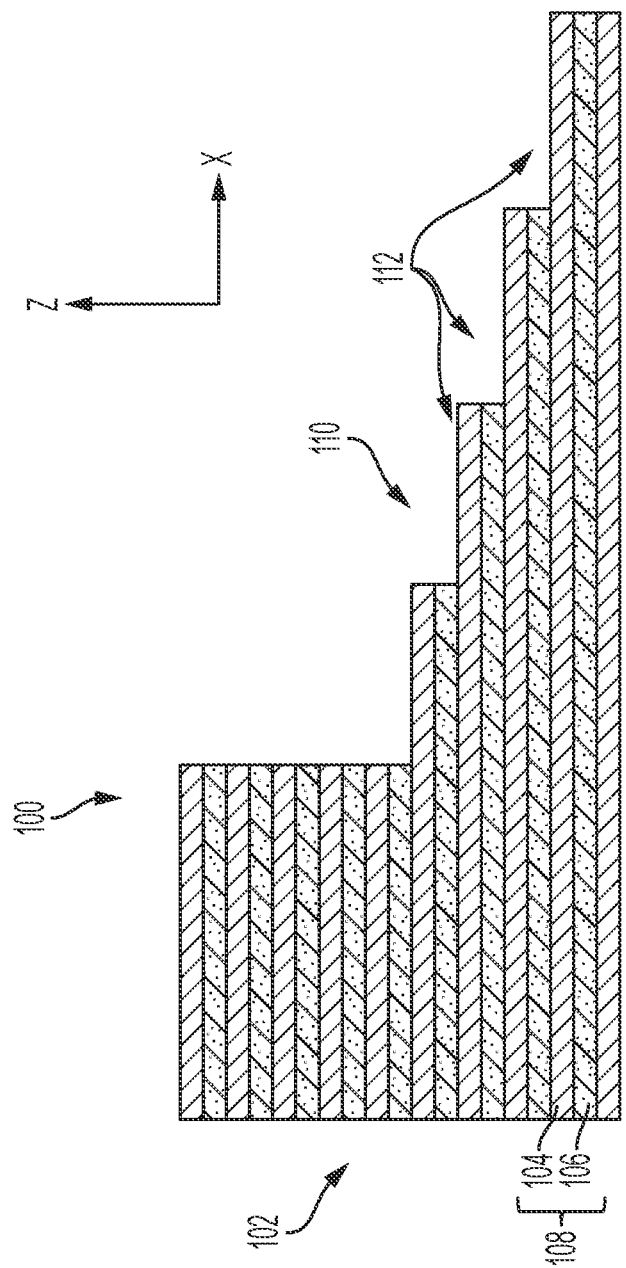

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "comprising," "including," "having," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1K are simplified partial cross-sectional views illustrating embodiments of a method of forming a microelectronic device (e.g., a memory device, such as a 3D NAND Flash memory device). The microelectronic devices formed through the methods of the disclosure may include staircase structures including beta (β) phase tungsten structures located at steps thereof. With the description provided below, it will be readily apparent to one of ordinary skill in the art that the methods and structures described herein may be used in various devices and electronic systems.

Referring to FIG. 1A, a microelectronic device structure 100 may be formed to include a preliminary stack structure 102. The preliminary stack structure 102 includes a vertically alternating (e.g., in the Z-direction) sequence of insulative structures 104 and additional insulative structures 106 arranged in tiers 108. Each of the tiers 108 of the preliminary stack structure 102 may include at least one of the insulative structures 104 vertically neighboring at least one of the additional insulative structures 106. The preliminary stack structure 102 may be formed to include any desired number of the tiers 108, such as greater than or equal to sixteen (16) tiers 108, greater than or equal to thirty-two (32) tiers 108, greater than or equal to sixty-four (64) tiers 108, or greater than or equal to one hundred twenty-eight (128) tiers 108.

The insulative structures 104 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 104 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the insulative structures 104 may individually include a substantially homogeneous distribution or a substantially heterogeneous distribution of the at least one electrically insulative material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, each of the insulative structures 104 exhibits a substantially homogeneous distribution of electrically insulative material. In further embodiments, at least one of the insulative structures 104 exhibits a substantially heterogeneous distribution of at least one electrically insulative material. One or more of the insulative structures 104 may, for example, be formed of and include a stack (e.g., laminate) of at least two different electrically insulative materials (e.g., at least two different dielectric materials). In some embodiments, each of the insulative structures 104 is formed of and includes silicon dioxide ($SiO_2$). The insulative structures 104 may each be substantially planar, and may each individually exhibit a desired thickness. In addition, each of the insulative structures 104 may be substantially the same (e.g., exhibit substantially the same material composition, material distribution, size, and shape) as one another, or at least one of the insulative structures 104 may be different (e.g., exhibit one or more of a different material composition, a different material distribution, a different size, and a different shape) than at least one other of the insulative structures 104. In some embodiments, each of the insulative structures 104 is substantially the same as each other of the insulative structures 104.

The additional insulative structures 106 of the tiers 108 of the preliminary stack structure 102 may be formed of and include at least one additional electrically insulative material. Material compositions of the additional insulative structures 106 and the insulative structures 104 may be selected such that the insulative structures 104 and the additional insulative structures 106 may be selectively removed relative to one another. The additional insulative structures 106 may be selectively etchable relative to the insulative structures 104 during common (e.g., collective, mutual) exposure to a first etchant, and the insulative structures 104 may be selectively etchable to the additional insulative structures 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the additional insulative structures 106 is different than a material composition of the insulative structures 104. The additional insulative structures 106 may comprise an additional electrically insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the additional insulative structures 106 are formed of and include a dielectric nitride material, such as $SiN_y$ (e.g., $Si_3N_4$). Each of the additional insulative structures 106 may individually include a substantially homogeneous distribution of the at least one additional electrically insulative material, or a substantially heterogeneous distribution of the at least one additional electrically insulative material. In some embodiments, each of the additional insulative structures 106 of the preliminary stack structure 102 exhibits a substantially homogeneous distribution of additional electrically insulative material. In additional embodiments, at least one of the additional insulative structures 106 of the preliminary stack structure 102 exhibits a substantially heterogeneous distribution of at least one additional electrically insulative material. The additional insulative structure(s) 106 may, for example, individually be formed of and include a stack (e.g., laminate) of at least two different additional electrically insulative materials. The additional insulative structures 106 may each be substantially planar, and may each individually exhibit a desired thickness.

With continued reference to FIG. 1A, the microelectronic device structure 100 may further include at least one staircase structure 110 including steps 112 (e.g., contact regions) defined by edges (e.g., horizontal ends) of the tiers 108. The staircase structure 110 may include a desired quantity of the steps 112. As shown in FIG. 1A, in some embodiments, the steps 112 of the staircase structure 110 are arranged in order, such that steps 112 horizontally neighboring one another in the X-direction correspond to tiers 108 of the preliminary stack structure 102 vertically neighboring one another in the Z-direction. In additional embodiments, the steps 112 of the staircase structure 110 are arranged out of order, such that at least some steps 112 of the staircase structure 110 horizontally neighboring one another in the X-direction correspond to tiers 108 of preliminary stack structure 102 not vertically neighboring one another in the Z-direction.

The preliminary stack structure 102 may include a desired quantity and distribution (e.g., spacing and arrangement) of staircase structures 110. The preliminary stack structure 102 may include a single (e.g., only one) staircase structure 110, or may include multiple (e.g., more than one) staircase structures 110. If the preliminary stack structure 102 includes multiple staircase structures 110, each of the staircase structures 110 may be positioned at a different vertical location (e.g., in the Z-direction) within the preliminary stack structure 102, or at least one of the staircase structures 110 may be positioned at substantially the same vertical location (e.g., in the Z-direction) within the preliminary stack structure 102 as at least one other of the staircase structures 110. If multiple staircase structures 110 are positioned at substantially the same vertical location (e.g., in the Z-direction) within the preliminary stack structure 102, the staircase structures 110 may be horizontally positioned in series with one another, in parallel with one another, or a combination thereof. If multiple staircase structures 110 at substantially the same vertical location (e.g., in the Z-direction) (if any) within the preliminary stack structure 102 are horizontally positioned in series with one another, each of the staircase structures 110 may exhibit a positive slope, each of the staircase structures 110 may exhibit a negative slope, or at least one of the staircase structures 110 may exhibit a positive slope and at least one other of the staircase structures 110 may exhibit a negative slope. For example, the preliminary stack structure 102 may include one or more stadium structures individually comprising a first staircase structure 110 having a positive slope, and a second staircase structure 110 horizontally neighboring and in series with the first staircase structure 110 and having a negative slope.

Figure 1B:
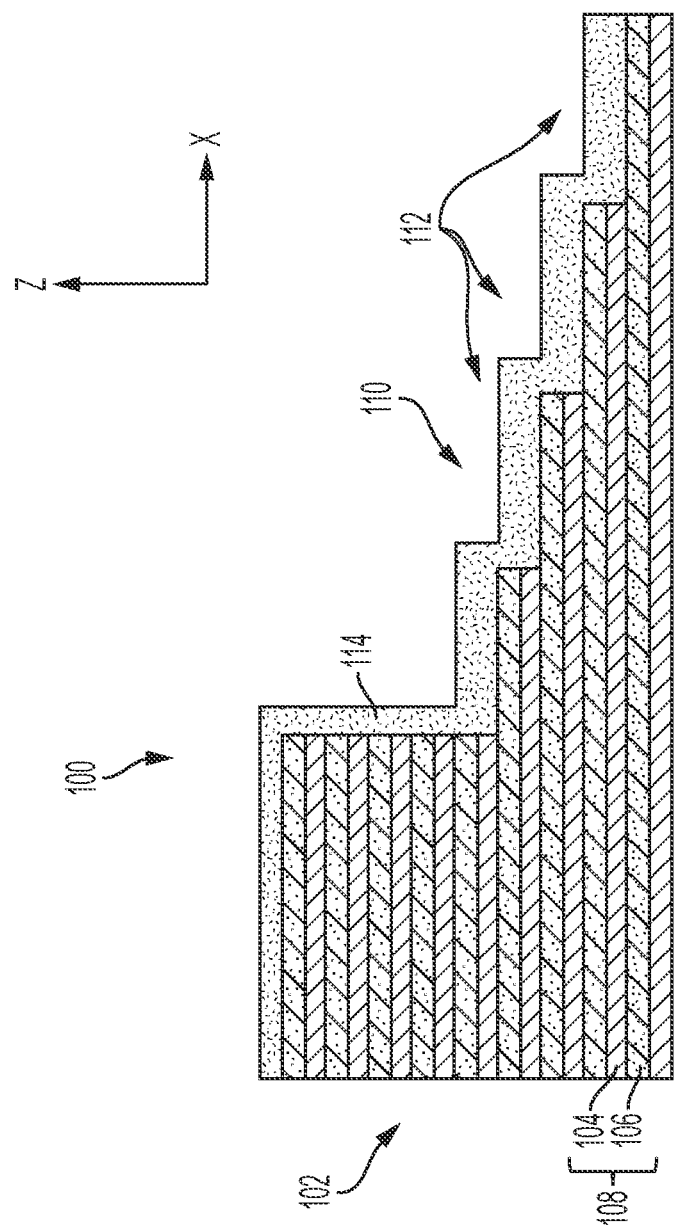

Referring next to FIG. 1B, optionally, a dielectric liner material 114 may be formed on or over exposed surfaces of the preliminary stack structure 102. As shown in FIG. 1B, the dielectric liner material 114 may be formed on or over exposed surfaces (e.g., exposed horizontal surfaces, exposed vertical surfaces) of the preliminary stack structure 102 at least partially defining the staircase structure 110. Optionally, the dielectric liner material 114 may also be formed on or over additional exposed surfaces (e.g., exposed horizontal surfaces, exposed vertical surfaces) of the preliminary stack structure 102 outside of the boundaries (e.g., horizontal boundaries, vertical boundaries) of the staircase structure 110. The dielectric liner material 114 (if formed) may at least partially (e.g., substantially) conform to a topography defined by the surfaces (e.g., horizontal surfaces, vertical surfaces) upon which the dielectric liner material 114 is formed. In additional embodiments, the dielectric liner material 114 is not formed on or over exposed surfaces of the preliminary stack structure 102.

The dielectric liner material 114, if formed, may be formed of and include at least one dielectric material having different etch selectivity than the additional insulative structures 106 of the preliminary stack structure 102. The dielectric liner material 114 may, for example, have an etch selectively substantially similar to that of the insulative structures 104 of preliminary stack structure 102. Portions of the dielectric liner material 114 may be employed to protect (e.g., mask) portions of the preliminary stack structure 102 during subsequent processing acts (e.g., subsequent material removal acts, such as subsequent etching acts), as described in further detail below. By way of non-limiting example, if formed, the dielectric liner material 114 may be formed of and include at least one oxygen-containing dielectric material, such as a one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric oxynitride material (e.g., $SiO_xN_y$), and a dielectric carboxynitride material (e.g., $SiO_xC_zN_y$). A material composition of the dielectric liner material 114 may be substantially the same as or may be different than a material composition of the insulative structures 104 of the preliminary stack structure 102. In some embodiments, the dielectric liner material 114 is formed of and includes $SiO_x$ (e.g., $SiO_2$).

The dielectric liner material 114, if formed, may be formed to exhibit a desirable thickness less than the horizontal dimension (e.g., width) in the X-direction of the individual steps 112 of the staircase structure 110. The thickness of the dielectric liner material 114 may, for example, be less than or equal to half of a width in the X-direction of a horizontally smallest step 112 of the staircase structure 110. By way of non-limiting example, the thickness of the dielectric liner material 114 may be within a range of from about 10 Angstroms (Å) to about to about 500 Å, such as within a range of from about 10 Å to about to about 200 Å. In some embodiments, a thickness of the dielectric liner material 114 is less than or equal to (e.g., substantially the same as) a thickness of an individual insulative structure 104 of preliminary stack structure 102.

The dielectric liner material 114 (if any) may be formed using one or more conventional conformal deposition processes, such as one or more of a conventional conformal CVD process and a conventional ALD process.

Figure 1C:
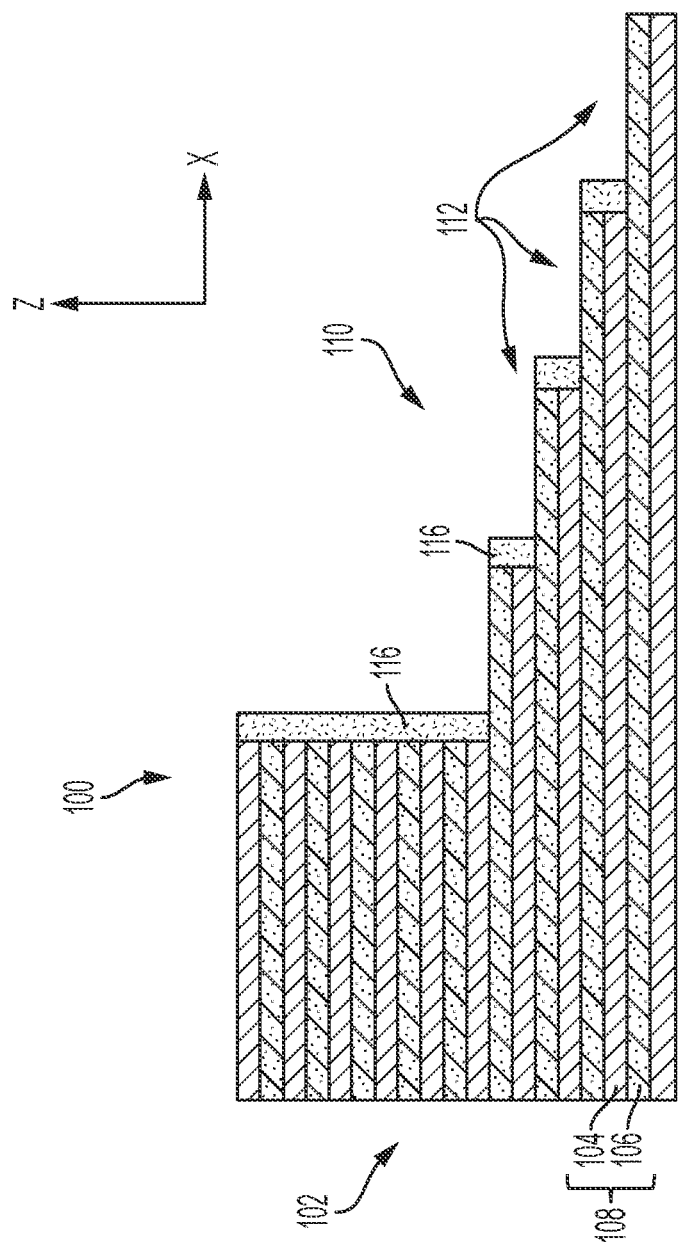

Referring next to FIG. 1C, portions of the insulative structures 104 of the preliminary stack structure 102 at the steps 112 of the staircase structure 110 may be selectively removed to expose horizontal surfaces (e.g., upper surfaces) of the additional insulative structures 106 of the preliminary stack structure 102 at the steps 112 of the staircase structure 110. As shown in FIG. 1C, if the dielectric liner material 114 (FIG. 1C) was previously formed, horizontally extending portions of the dielectric liner material 114 (FIG. 1C) at the steps 112 of the staircase structure 110 may also be removed while maintaining vertically extending (e.g., in the Z-direction) portions of the dielectric liner material 114 (FIG. 1C) to form dielectric spacer structures 116 at horizontal ends (e.g., in the X-direction) of the steps 112 of the staircase structure 110. The dielectric spacer structures 116 may cover vertically extending surfaces (e.g., side surfaces) of the preliminary stack structure 102 at the steps 112 of the staircase structure 110, such as vertically extending surfaces (e.g., side surfaces) of the insulative structures 104 and the additional insulative structures 106 of the preliminary stack structure 102. If the dielectric liner material 114 (FIG. 1C) was also formed outside of the boundaries (e.g., horizontal boundaries, vertical boundaries) of the staircase structure 110, some of the dielectric spacer structures 116 may be formed to cover vertically extending surfaces of the preliminary stack structure 102 outside of the boundaries (e.g., horizontal boundaries, vertical boundaries) of the staircase structure 110.

Portions of the insulative structures 104, and, optionally, the dielectric liner material 114 (FIG. 1C) (if any) at the steps 112 of the staircase structure 110 may be selectively removed using conventional material removal processes (e.g., conventional etching processes) and conventional material removal equipment, which are not described in detail herein. For example, at least portions of the insulative structures 104 and the dielectric liner material 114 (FIG. 1C) (if any) located within the boundaries (e.g., horizontal boundaries, vertical boundaries) of the staircase structure 110 may be subjected to a conventional anisotropic etching process (e.g., a conventional anisotropic dry etching process) to expose the horizontal surfaces of the additional insulative structures 106 of the preliminary stack structure 102 at the steps 112 of the staircase structure 110 and form the dielectric spacer structures 116 (if the dielectric liner material 114 (FIG. 1C) was previously formed).

Figure 1D:
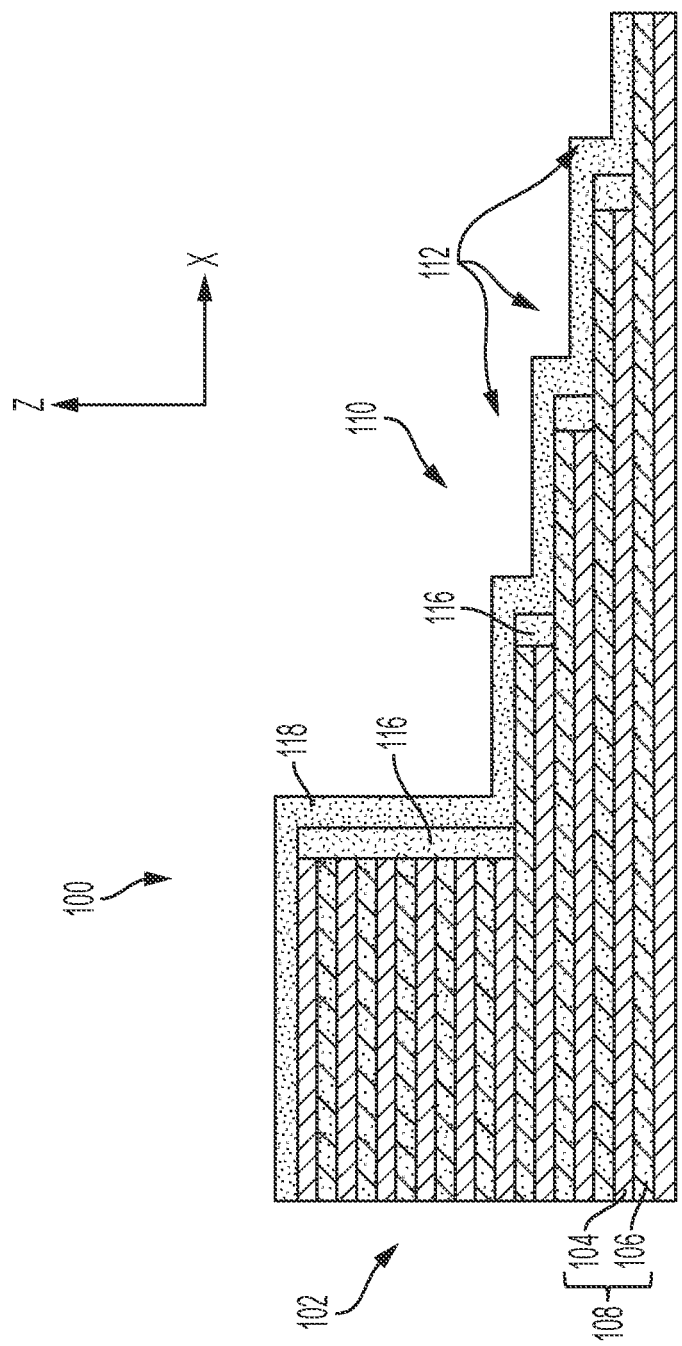

Referring next to FIG. 1D, a semiconductive liner material 118 may be formed on or over exposed upper surfaces of the microelectronic device structure 100. The semiconductive liner material 118 may be formed to cover exposed horizontally extending surfaces and exposed vertically extending surfaces of the microelectronic device structure 100 inside of and outside of boundaries (e.g., horizontal boundaries, vertical boundaries) of the staircase structure 110. For example, as shown in FIG. 1D, the semiconductive liner material 118 may be formed on or over exposed surfaces of the additional insulative structures 106 and the dielectric spacer structures 116 (if any) within the boundaries of the staircase structure 110, as well as on or over exposed surfaces of the insulative structures 104, the additional insulative structures 106, and the dielectric spacer structures 116 (if any) outside of the boundaries of the staircase structure 110. The semiconductive liner material 118 may at least partially (e.g., substantially) conform to a topography defined by the surfaces (e.g., horizontal surfaces, vertical surfaces) upon which the semiconductive liner material 118 is formed.

The semiconductive liner material 118 may be formed of and include of at least one semiconductive material, such as one or more of a silicon material, a silicon-germanium material, a boron material, a germanium material, a gallium arsenide material, a gallium nitride material, and an indium phosphide material. By way of non-limiting example, the semiconductive liner material 118 may be formed of and include at least one silicon material. As used herein, the term "silicon material" means and includes a material that includes elemental silicon or a compound of silicon. The semiconductive liner material 118 may, for example, be formed of and include one or more monocrystalline silicon and polycrystalline silicon. In some embodiments, the semiconductive liner material 118 comprises polycrystalline silicon.

The semiconductive liner material 118 may be formed to exhibit a desirable thickness less than the horizontal dimension (e.g., width) in the X-direction of the individual steps 112 of the staircase structure 110. The thickness of the dielectric liner material 114 may, for example, be less than or equal to a thickness of one of the tiers 108 (including the combined thicknesses of the insulative structure 104 and the additional insulative structure 106 thereof) of the preliminary stack structure 102. By way of non-limiting example, the thickness of the dielectric liner material 114 may be within a range of from about 20 Angstroms (Å) to about to about 500 Å, such as within a range of from about 20 Å to about to about 400 Å, or from about 20 Å to about to about 300 Å.

The semiconductive liner material 118 may be formed using one or more conventional conformal deposition processes, such as one or more of a conventional conformal CVD process and a conventional ALD process.

Figure 1E:
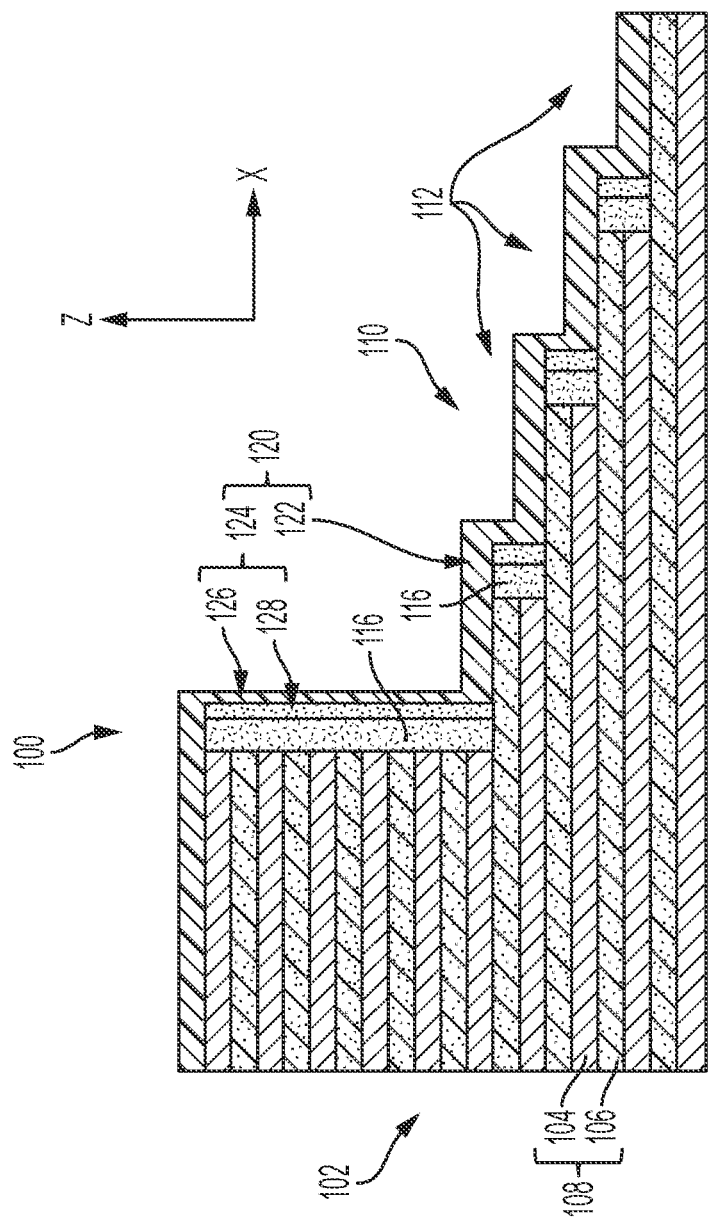

Next, referring next to FIG. 1E, the semiconductive liner material 118 (FIG. 1D) may be doped (e.g., impregnated) with one or more dopants (e.g., chemical species) to form a doped semiconductive liner material 120. As shown in FIG. 1E, the doped semiconductive liner material 120 may include horizontally extending portions 122 and vertically extending portions 124. A maximum vertical depth (e.g., in the Z-direction) of the dopant(s) within the horizontally extending portions 122 of the doped semiconductive liner material 120 may be greater than a maximum horizontal depth (e.g., in the X-direction) of the dopant(s) within the vertically extending portions 124 of the doped semiconductive liner material 120. Put another way, the dopant(s) may extend relatively deeper into thicknesses (e.g., in the Z-direction) of the horizontally extending portions 122 of the doped semiconductive liner material 120 than into thicknesses (e.g., in the X-direction) of the vertically extending portions 124 of the doped semiconductive liner material 120. In some embodiments, the dopant(s) are dispersed to or substantially proximate lower vertical boundaries (e.g., in the Z-direction) of the horizontally extending portions 122 of the doped semiconductive liner material 120; and the dopant(s) are dispersed only partially through (e.g., less than completely through, such as less than or equal to about 75 percent through, less than or equal to about 50 percent through, or less than or equal to about 25 percent through) the thicknesses (e.g., in the X-direction) of the vertically extending portions 124 of the doped semiconductive liner material 120. For example, as shown in FIG. 1E, the vertically extending portions 124 of the doped semiconductive liner material 120 may include doped regions 126, and substantially undoped regions 128 horizontally adjacent to (e.g., horizontally underlying in the X-direction) the doped regions 126.

The dopant(s) of the doped semiconductive liner material 120 may comprise material(s) promoting or facilitating the subsequent formation of tungsten (e.g., (3-phase tungsten) from the doped semiconductive liner material 120, as described in further detail below. In some embodiments, the dopant(s) comprise at least one N-type dopant, such as one or more of phosphorus (P), arsenic (Ar), antimony (Sb), and bismuth (Bi). In additional embodiments, the dopant(s) comprise at least one P-type dopant, such as one or more of boron (B), aluminum (Al), and gallium (Ga). In further embodiments, the dopant(s) comprise one or more of carbon (C), fluorine (F), chlorine (Cl), bromine (Br), hydrogen (H), deuterium ($^2$H), helium (He), neon (Ne), and argon (Ar).

The horizontally extending portions 122 of the doped semiconductive liner material 120 may individually exhibit a substantially homogeneous distribution of dopant(s) within the semiconductive material thereof, or may individually exhibit a heterogeneous distribution of dopant(s)

within the semiconductive material thereof. In some embodiments, each of the horizontally extending portions 122 of the doped semiconductive liner material 120 exhibits a substantially homogeneous distribution of dopant(s) within the semiconductive material thereof, such that the horizontally extending portion 122 exhibits a substantially uniform (e.g., even, non-variable) distribution of the dopant(s) within the semiconductive material thereof. For example, amounts (e.g., atomic concentrations) of the dopant(s) included in each individual horizontally extending portion 122 of the doped semiconductive liner material 120 may not substantially vary throughout the vertical dimensions (e.g., in the Z-direction) of the horizontally extending portion 122. In additional embodiments, one or more (e.g., each) of the horizontally extending portions 122 of the doped semiconductive liner material 120 exhibits a substantially heterogeneous distribution of dopant(s) within the semiconductive material thereof, such that the horizontally extending portion(s) 122 exhibit a substantially non-uniform (e.g., non-even, variable) distribution of the dopant(s) within the semiconductive material thereof. For example, amounts (e.g., atomic concentrations) of the dopant(s) included in each individual of the horizontally extending portion 122 of the doped semiconductive liner material 120 may vary (e.g., increase, decrease) throughout vertical dimensions (e.g., in the Z-direction) of the horizontally extending portion 122.

As previously discussed, the vertically extending portions 124 of the doped semiconductive liner material 120 may individually exhibit a heterogeneous distribution of dopant(s) within the semiconductive material thereof, such that each vertically extending portion 124 individual exhibits a doped region 126 and a substantially undoped region 128. In turn, each of the doped regions 126 of the vertically extending portions 124 of the doped semiconductive liner material 120 may individually exhibit a substantially homogeneous distribution of dopant(s) within the semiconductive material thereof, or may individually exhibit a heterogeneous distribution of dopant(s) within the semiconductive material thereof. In some embodiments, each of the doped regions 126 of the vertically extending portions 124 of the doped semiconductive liner material 120 exhibits a substantially homogeneous distribution of dopant(s) within the semiconductive material thereof, such that the doped region 126 of the vertically extending portion 124 exhibits a substantially uniform (e.g., even, non-variable) distribution of the dopant(s) within the semiconductive material thereof. For example, amounts (e.g., atomic concentrations) of the dopant(s) included in each individual doped region 126 may not substantially vary throughout the horizontal dimensions (e.g., in the X-direction) of the doped region 126. In additional embodiments, one or more (e.g., each) of the doped regions 126 of the vertically extending portions 124 of the doped semiconductive liner material 120 exhibits a substantially heterogeneous distribution of dopant(s) within the semiconductive material thereof, such that the doped region(s) 126 of the vertically extending portion(s) 124 exhibit a substantially non-uniform (e.g., non-even, variable) distribution of the dopant(s) within the semiconductive material thereof. For example, amounts (e.g., atomic concentrations) of the dopant(s) included in each individual of the doped region 126 may vary (e.g., increase, decrease) throughout horizontal dimensions (e.g., in the X-direction) of the doped region 126.

The semiconductive liner material 118 (FIG. 1D) may be doped with at least one dopant to form a doped semiconductive liner material 120 using conventional processes (e.g., conventional implantation processes, conventional diffusion processes), which are not described in detail herein. As a non-limiting example, one or more phosphorus-containing species (e.g., phosphorus atoms, phosphorus-containing molecules, phosphide ions, phosphorus-containing ions) may be implanted into the semiconductive liner material 118 (FIG. 1D) to form the doped semiconductive liner material 120. The phosphorus-containing species may, for example, comprise phosphide ions ($P^{3-}$). As another non-limiting example, one or more arsenic-containing species (e.g., arsenic atoms, arsenic-containing molecules, arsenic ions, arsenic-containing ions) may be implanted into the semiconductive liner material 118 (FIG. 1D) to form the doped semiconductive liner material 120. The arsenic-containing species may, for example, comprise arsenic ions ($As^{3+}$). In some embodiments, following dopant implantation, an amount of dopant within at least the horizontally extending portions 122 of the doped semiconductive liner material 120 is within a range of from about 0.001 atomic percent to about 10 atomic percent.

Figure 1F:
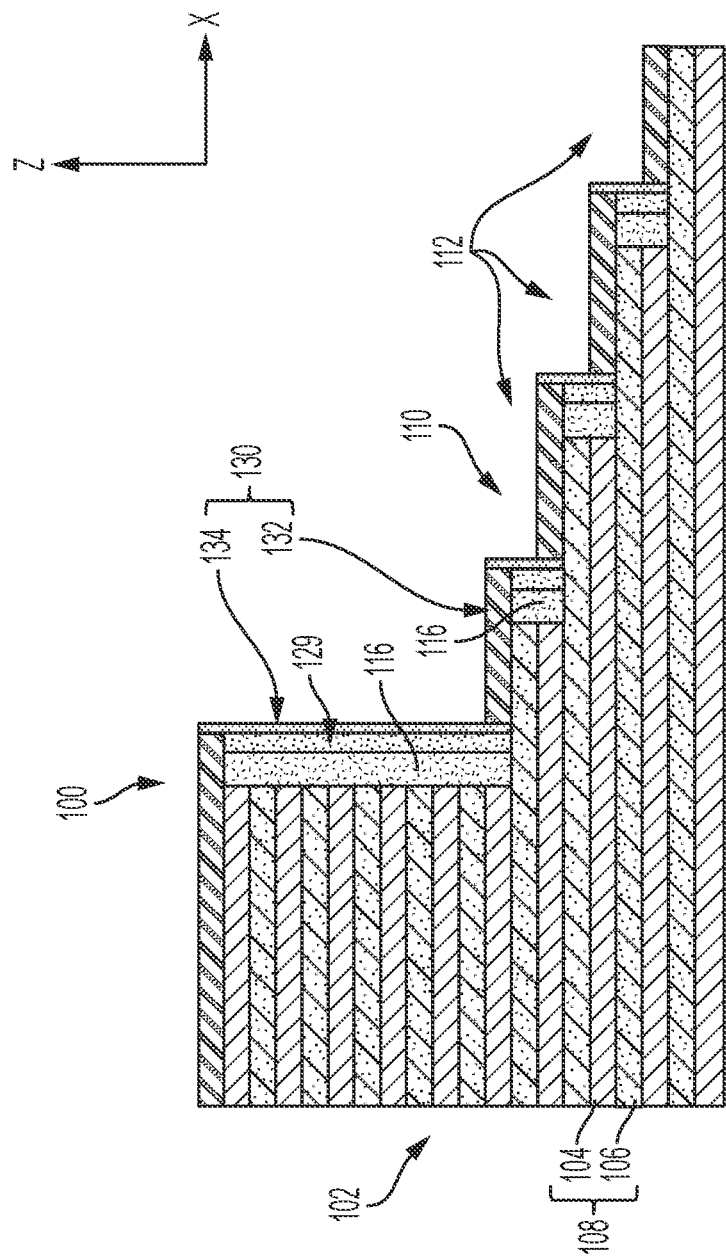

Referring next to FIG. 1F, portions of the doped semiconductive liner material 120 (FIG. 1E) may be converted into a tungsten liner material 130 including tungsten and the dopant(s) of the doped semiconductive liner material 120 (FIG. 1E). The conversion process may convert portions of the semiconductive material (e.g., silicon material, such as polycrystalline silicon) of the doped semiconductive liner material 120 (FIG. 1E) including dopant(s) dispersed therein into tungsten relatively faster than semiconductive material of the doped semiconductive liner material 120 (FIG. 1E) not including the dopant(s) dispersed therein. Thus, as shown in FIG. 1F, the conversion process may convert the horizontally extending portions 122 (FIG. 1E) and the doped regions 126 (FIG. 1E) of the vertically extending portions 124 (FIG. 1E) of the doped semiconductive liner material 120 (FIG. 1E) into the tungsten liner material 130, while at least partially (e.g., substantially) maintaining the substantially undoped regions 128 (FIG. 1E) of the doped semiconductive liner material 120 (FIG. 1E) to form semiconductive spacer structures 129 (e.g., polysilicon spacer structures). The tungsten liner material 130 may include horizontally extending portions 132 formed from the horizontally extending portions 122 (FIG. 1E) of the doped semiconductive liner material 120 (FIG. 1E), and vertically extending portions 134 formed from the doped regions 126 (FIG. 1E) of the vertically extending portions 124 (FIG. 1E) of the doped semiconductive liner material 120 (FIG. 1E). The semiconductive spacer structures 129 may be positioned horizontally adjacent to (e.g., horizontally under in the X-direction) the vertically extending portions 134 of the tungsten liner material 130.

At least some of the tungsten of the tungsten liner material 130 may comprise β-phase tungsten. β-phase tungsten has a metastable, A15 cubic structure. Grains of the β-phase tungsten may exhibit generally columnar shapes. Tungsten included within the tungsten liner material 130 may only be present in the β-phase, or may be present in the β-phase and in the alpha (α) phase. If present, the α-phase tungsten has a metastable, body-centered cubic structure. Grains of the α-phase tungsten may exhibit generally isometric shapes. If the tungsten liner material 130 includes β-phase tungsten and α-phase tungsten, an amount of β-phase tungsten included in the tungsten liner material 130 may be different than an amount of α-phase tungsten included in the tungsten liner material 130, or may be substantially the same as amount of α-phase tungsten included in the tungsten liner material 130. In some embodiments, an amount of β-phase tungsten included in the tungsten liner material 130 is greater than an amount of α-phase tungsten included in the tungsten liner material 130. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the tungsten liner material 130 may be present in the β-phase.

The dopant(s) included in the tungsten liner material 130 may be substantially the same as the dopant(s) included in the doped semiconductive liner material 120 (FIG. 1E) employed to form the tungsten liner material 130. For example, dopant(s) (e.g., N-type dopants, P-type dopants, other dopants) included in the horizontally extending portions 122 (FIG. 1E) and the doped regions 126 (FIG. 1E) of the vertically extending portions 124 (FIG. 1E) of the doped semiconductive liner material 120 (FIG. 1E) may also be present in the horizontally extending portions 132 and the vertically extending portions 134 of the tungsten liner material 130. In some embodiments, the tungsten liner material 130 includes β-phase tungsten doped with one or more of As and P. The dopant(s) of the tungsten liner material 130 may support (e.g., facilitate, promote) the stability of the β-phase tungsten of the tungsten liner material 130.

The tungsten liner material 130 may exhibit a substantially homogeneous distribution of the dopant(s) thereof, or may exhibit a heterogeneous distribution of the dopant(s) thereof. The distribution of the dopant(s) within the tungsten liner material 130 may be substantially the same as or may be different than a distribution of the dopant(s) within dopant-containing portions (e.g., the horizontally extending portions 122 and the doped regions 126 of the vertically extending portions 124) of the doped semiconductive liner material 120 (FIG. 1E). In some embodiments, a distribution of the dopant(s) within the tungsten liner material 130 is substantially the same as a distribution of the dopant(s) within the horizontally extending portions 122 (FIG. 1E) and the doped regions 126 (FIG. 1E) of the vertically extending portions 124 (FIG. 1E) of the doped semiconductive liner material 120 (FIG. 1E).

The tungsten liner material 130 may be formed by treating the doped semiconductive liner material 120 (FIG. 1E) with one or more chemical species facilitating the conversion of the semiconductive material (e.g., silicon material) thereof into tungsten (e.g., β-phase tungsten, α-phase tungsten). By way of non-limiting example, if the doped semiconductive liner material 120 (FIG. 1E) comprises a doped silicon material, such as doped polycrystalline silicon, the doped semiconductive liner material 120 (FIG. 1E) may be treated with tungsten hexafluoride ($WF_6$) to form the tungsten liner material 130. Silicon (Si) of the doped semiconductive liner material 120 (FIG. 1E) may react with the $WF_6$ to produce tungsten (W) and silicon tetrafluoride ($SiF_4$). The produced $SiF_4$ is removed as a gas. The produced W remains with the dopant(s) of the doped semiconductive liner material 120 (FIG. 1E) to form the tungsten liner material 130. The doped semiconductive liner material 120 (FIG. 1E) may, for example, be treated with $WF_6$ using a conventional CVD apparatus at a temperature within a range of from about 200° C. to about 500° C.

Figure 1G:
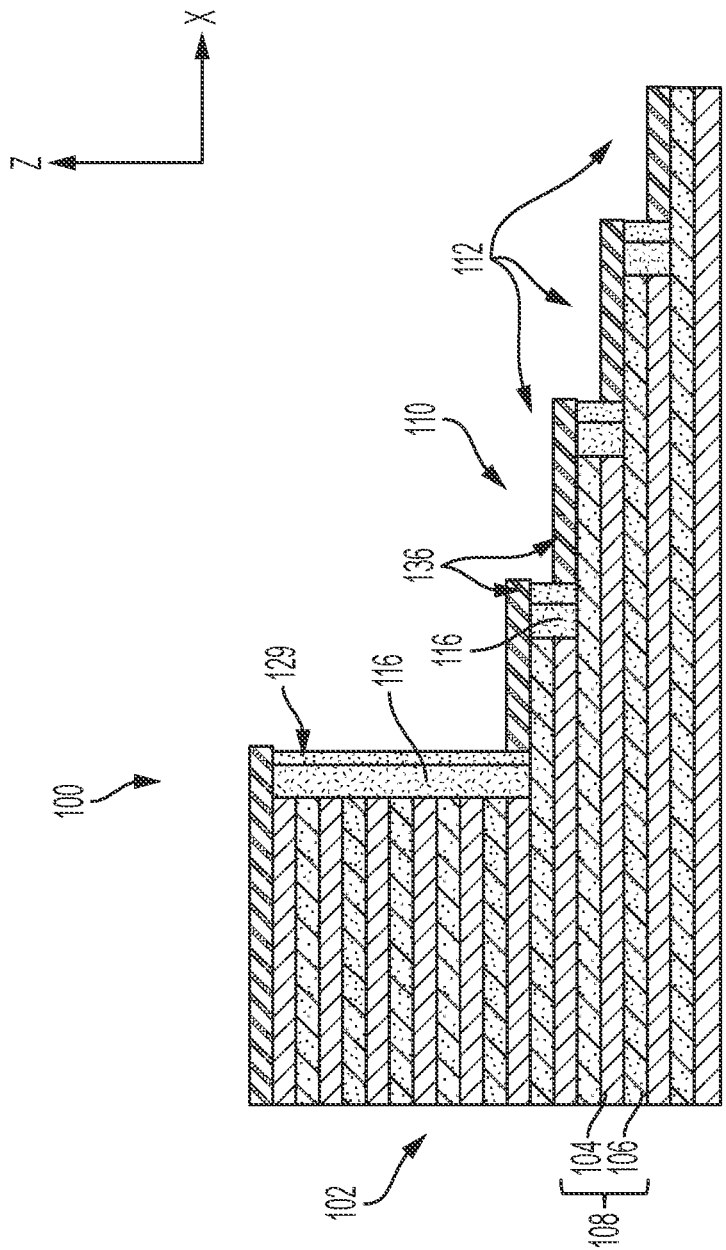

Referring next to FIG. 1G, the vertically extending portions 134 (FIG. 1F) of the tungsten liner material 130 (FIG. 1F) may be substantially removed to expose vertically extending surfaces of the semiconductive spacer structures 129. Portions of the horizontally extending portions 132 (FIG. 1F) of the tungsten liner material 130 (FIG. 1F) remain following the removal of the vertically extending portions 134 (FIG. 1F) of the tungsten liner material 130 (FIG. 1F) to form tungsten pad structures 136. The tungsten pad structures 136 may be separate and discrete from one another. As shown in FIG. 1G, at least some of the tungsten pad structures 136 may be positioned vertically on portions of the additional insulative structures 106 of the preliminary stack structure 102 at the steps 112 of the staircase structure 110. The at least some of the tungsten pad structures 136 may also be positioned vertically on portions of the dielectric spacer structures 116 and the semiconductive spacer structures 129 at the steps 112 of the staircase structure 110. As shown in FIG. 1G, one or more additional tungsten pad structures 136 may be positioned on or over surfaces of the preliminary stack structure 102 outside of the boundaries (e.g., horizontal boundaries, vertical boundaries) of the staircase structure 110.

Thicknesses (e.g., in the Z-direction) of the tungsten pad structures 136 may be less than or equal to thicknesses of the horizontally extending portions 132 (FIG. 1F) of the tungsten liner material 130 (FIG. 1F). In some embodiments, the material removal process employed to substantially remove the vertically extending portions 134 (FIG. 1F) of the tungsten liner material 130 (FIG. 1F) also partially removes the horizontally extending portions 132 (FIG. 1F) of the tungsten liner material 130 (FIG. 1F), such that a thickness of each of the tungsten pad structures 136 is less than (e.g., thinner than) a thickness of the horizontally extending portion 132 (FIG. 1F) of the tungsten liner material 130 (FIG. 1F) from which the tungsten pad structure 136 was formed. In some embodiments, each of the tungsten pad structures 136 individually has a thickness within a range of from about 10 percent to about 70 percent (e.g., from about 30 percent to about 70 percent, from about 40 percent to about 60 percent) of a thickness of the horizontally extending portion 132 (FIG. 1F) of the tungsten liner material 130 (FIG. 1F) from which the tungsten pad structure 136 was formed.

The vertically extending portions 134 (FIG. 1F) of the tungsten liner material 130 (FIG. 1F) may be removed (and the tungsten pad structures 136 may be formed) by treating the tungsten liner material 130 (FIG. 1F) with at least one etchant (e.g., wet etchant). By way of non-limiting example, the etchant may comprise a phosphoric-acetic-nitric acid (PAN) etchant. The tungsten liner material 130 (FIG. 1F) may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Referring next to FIG. 1H, the semiconductive spacer structures 129 (FIG. 1G) may be selectively removed. The selective removal of the semiconductive spacer structures 129 (FIG. 1G) may expose portions of the additional insulative structures 106 of the preliminary stack structure 102 at the steps 112 of the staircase structure 110. For example, the selective removal of the semiconductive spacer structures 129 (FIG. 1G) may expose portions of horizontal surfaces (e.g., upper surfaces) of the additional insulative structures 106 previously covered by (e.g., directly adjacent to) the semiconductive spacer structures 129 (FIG. 1G). The selective removal of the semiconductive spacer structures 129 (FIG. 1G) may also expose vertical surfaces (e.g., side surfaces) of the insulative structures 104 at the steps 112 of the staircase structure 110, and vertical surfaces (e.g., side surfaces) of the dielectric spacer structures 116 (if any) at the steps 112 of the staircase structure 110. In addition, if one or more of the semiconductive spacer structures 129 (FIG. 1G) are located outside of the boundaries (e.g., vertical boundaries, horizontal boundaries) of the staircase structure 110, the selective removal of the one or more of the semiconductive spacer structures 129 (FIG. 1G) may also uncover (e.g., expose) surfaces of the microelectronic device structure 100 (e.g., surfaces of one or more of the insulative structures 104, the additional insulative structures 106, and the dielectric spacer structures 116 (if any)) directly adjacent (e.g., directly horizontally adjacent, directly vertically adjacent) to the one or more of the semiconductive spacer structures 129 (FIG. 1G).

As shown in FIG. 1H, the selective removal of the semiconductive spacer structures 129 (FIG. 1G) may form air gaps 138 intervening between neighboring tungsten pad structures 136. The air gaps 138 may each individually vertically extend (e.g., in the Z-direction) from a lower vertical boundary (e.g., a lower surface) of a relatively vertically higher tungsten pad structure 136 to a lower vertical boundary (e.g., a lower surface) of a relatively vertically lower tungsten pad structure 136 horizontally neighboring the relatively vertically higher tungsten pad structure 136. In addition, the air gaps 138 may each individually horizontally extend (e.g., in the X-direction) from a horizontal boundary (e.g., a side surface) of one of the tungsten pad structures 136 to a horizontal boundary of at least one other structure (e.g., dielectric spacer structure 116 (if any), insulative structure 104, additional insulative structure 106) of the microelectronic device structure 100 horizontally neighboring the tungsten pad structure 136.

The semiconductive spacer structures 129 (FIG. 1G) may be selectively removed by treating the microelectronic device structure 100 with at least one etchant (e.g., wet etchant) formulated to remove the semiconductive spacer structures 129 (FIG. 1G) without substantially removing exposed portions of the tungsten pad structures 136, the dielectric spacer structures 116 (if any), the insulative structures 104, and additional insulative structures 106. By way of non-limiting example, the etchant may comprise one or more of hydrofluoric acid (HF), a buffered oxide etchant (BOE), and nitric acid ($HNO_3$). In some embodiments, the etchant comprises a solution including water and HF at a ratio within a range of from about 500:1 to about 100:1. The material removal process may selectively remove the semiconductive spacer structures 129 (FIG. 1G), and may also clean and rinse exposed surfaces of the preliminary stack structure 102, the dielectric spacer structure 116 (if any), and the tungsten pad structures 136. In some embodiments, the material removal process includes treating the microelectronic device structure 100 with an aqueous HF solution, followed by treatment with tetramethylammonium hydroxide (TMAH).

Figure 1I:
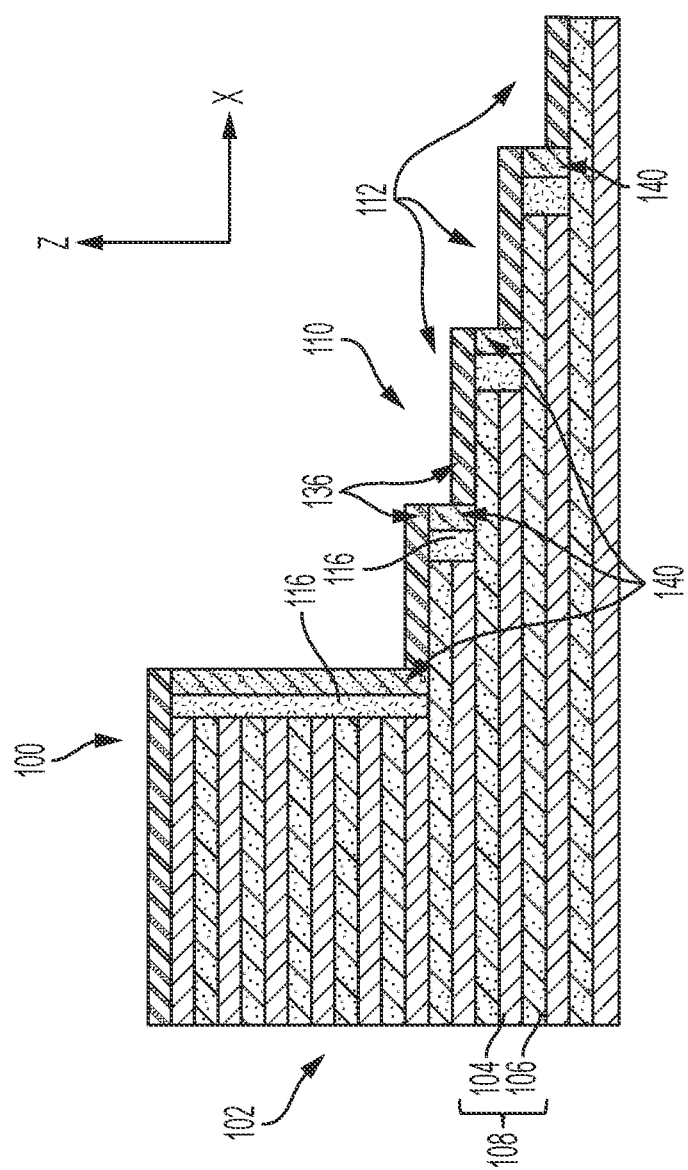
Figure 1J:
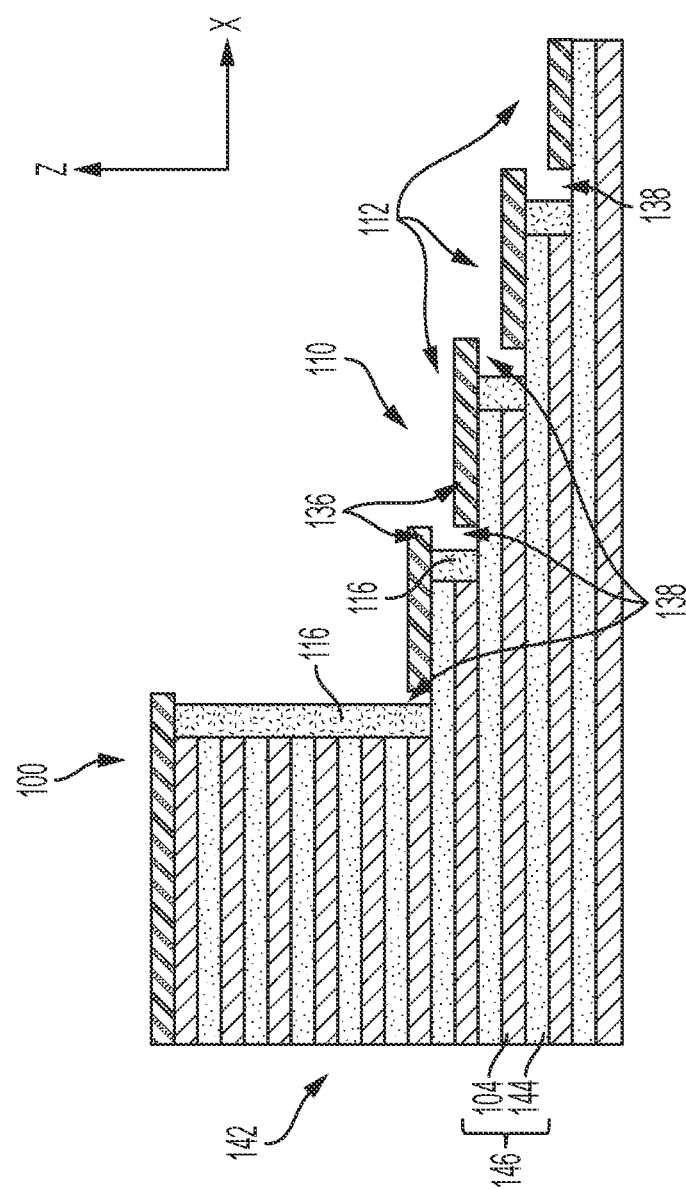

Referring to FIG. 1I, in additional embodiments, rather than removing the semiconductive spacer structures 129 (FIG. 1G) to form the air gaps 138 (FIG. 1H), the semiconductive spacer structures 129 (FIG. 1G) may be converted to insulative spacer structures 140. The insulative spacer structures 140 may, for example, be formed of and include a dielectric oxide material (e.g., $SiO_x$) formed by oxidizing the semiconductive material (e.g., silicon material) of the semiconductive spacer structures 129 (FIG. 1G). In some embodiments, the insulative spacer structures 140 are formed of and include $SiO_x$ (e.g., $SiO_2$). In additional embodiments, the insulative spacer structures 140 are formed of and include a different dielectric material, such as a dielectric oxynitride material (e.g., $SiO_xN_y$).

As shown in FIG. 1I, the insulative spacer structures 140 may intervene between neighboring tungsten pad structures 136. The insulative spacer structures 140 may each individually vertically extend (e.g., in the Z-direction) from a lower vertical boundary (e.g., a lower surface) of a relatively vertically higher tungsten pad structure 136 to a lower vertical boundary (e.g., a lower surface) of a relatively vertically lower tungsten pad structure 136 horizontally neighboring the relatively vertically higher tungsten pad structure 136. In addition, the insulative spacer structures 140 may each individually horizontally extend (e.g., in the X-direction) from a horizontal boundary (e.g., a side surface) of one of the tungsten pad structures 136 to a horizontal boundary of at least one other structure (e.g., dielectric spacer structure 116 (if any), insulative structure 104, additional insulative structure 106) of the microelectronic device structure 100 horizontally neighboring the tungsten pad structure 136.

The insulative spacer structures 140 (if formed) may be formed using one or more conventional processes (e.g., a conventional oxidation process), which are not described in detail herein. As a non-limiting example, the semiconductive spacer structures 129 (FIG. 1G) may be exposed to an oxygen-containing atmosphere (e.g., an atmosphere containing $O_2$ gas and/or another oxidizing agent) to form the insulative spacer structures 140. In some embodiments, the semiconductive spacer structures 129 (FIG. 1G) are exposed to air for a sufficient period of time to form the insulative spacer structures 140.

With returned reference to FIG. 1H, following the formation of the air gaps 138 (or the insulative spacer structures 140 (FIG. 1I)), the microelectronic device structure 100 is subjected to additional processing to at least partially replace the additional insulative structures 106 of the preliminary stack structure 102 with conductive structures. For example, referring to FIG. 1J, the microelectronic device structure 100 at the processing stage depicted in FIG. 1H (or FIG. 1I) may be subjected to so called "replacement gate" or "gate last" processing acts to at least partially replace the additional insulative structures 106 (FIG. 1H) of the tiers 108 (FIG. 1H) of the preliminary stack structure 102 (FIG. 1H) with conductive structures 144 and form a stack structure 142. The stack structure 142 includes vertically alternating (e.g., in the Z-direction) sequence of the insulative structures 104 and the conductive structures 144 arranged in tiers 146. Each of the tiers 146 of the stack structure 142 includes at least one of the insulative structures 104 vertically neighboring at least one of the conductive structures 144. The conductive structures 144 may contact (e.g., physically contact, electrically contact) the tungsten pad structures 136 at the steps 112 of the staircase structure 110.

The conductive structures 144 may be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive structures 144 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Jr), iridium oxide ($IrO_z$), ruthenium (Ru), ruthenium oxide (RuO$_z$), and conductively doped silicon. In some embodiments, the conductive structures 144 are formed of and include tungsten (W).

At least some of the electrically conductive material (e.g., tungsten) of the conductive structures 144 may have a different crystalline phase structure than that of the tungsten of the tungsten pad structures 136. By way of non-limiting example, the conductive structures 144 may be formed to comprise α-phase tungsten. Tungsten included within the conductive structures 144 may only be present in the α-phase, or may be present in the α-phase and in the β-phase. If the conductive structures 144 include α-phase tungsten and β-phase tungsten, amounts of α-phase tungsten included in the conductive structures 144 may be greater than amounts of β-phase tungsten included in the conductive structures 144. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the conductive structures 144 may be present in the α-phase. In some embodiments, the conductive structures 144 are formed of and include α-phase tungsten, and the tungsten pad structures 136 are formed of and include β-phase tungsten.

During replace gate processing, the preliminary stack structure 102 (FIG. 1H) may be subjected to a material removal process to selectively remove (e.g., selectively exhume) at least a portion (e.g., all, less than all) of each the additional insulative structures 106 (FIG. 1H) relative to the insulative structures 104. For example, slots (e.g., slits, openings, trenches) may be formed to vertically extend (e.g., in the Z-direction) through the preliminary stack structure 102 (FIG. 1H), and then portions of the additional insulative structures 106 may be selectively removed through the slots using one or more etchants. Thereafter, open volumes (e.g., void spaces) formed by the removed portions of the additional insulative structures 106 (FIG. 1H) may be filled with electrically conductive material (e.g., tungsten) to form the conductive structures 144.

Figure 1K:
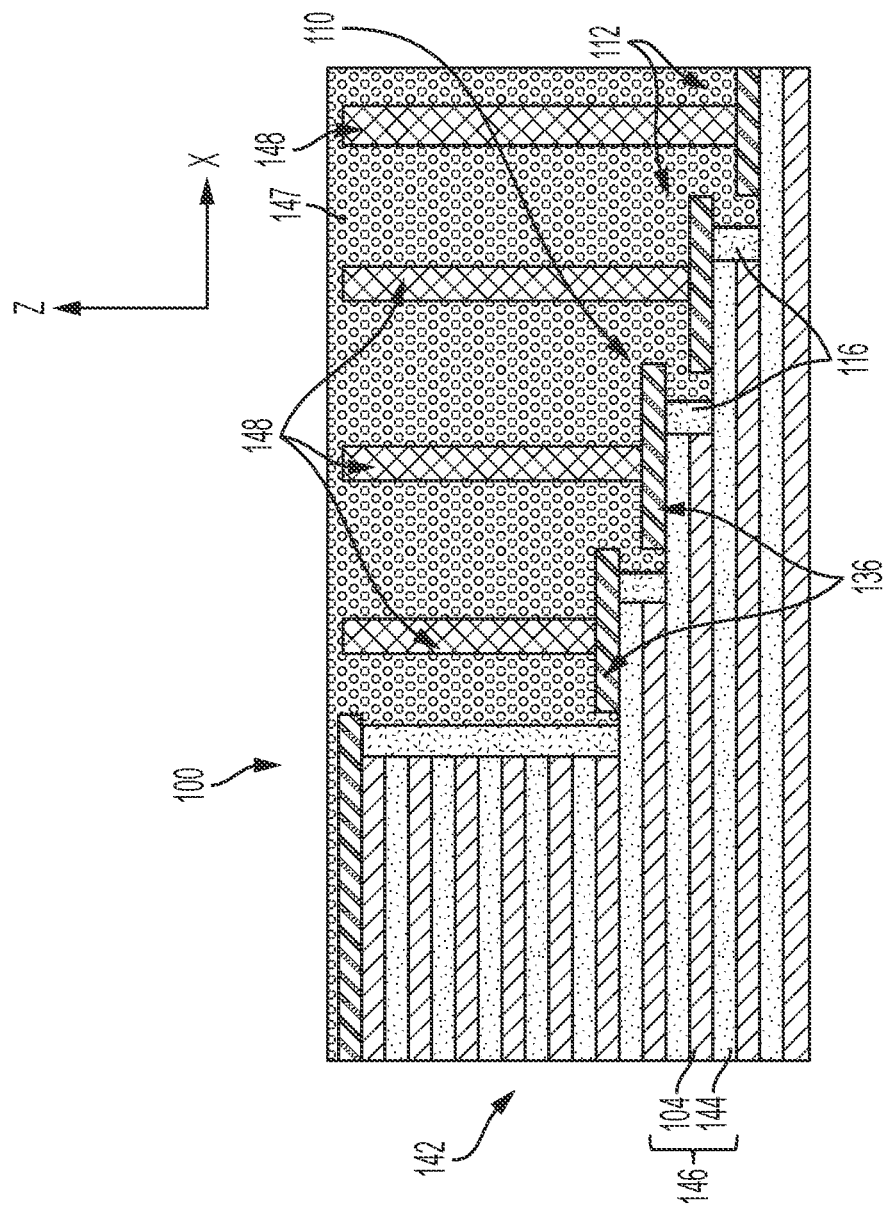

Referring next to FIG. 1K, an isolation material 147 may be formed on or over the stack structure 142, the staircase structure 110, and the tungsten pad structures 136; and conductive contact structures 148 may be formed to vertically extend through the isolation material 147 and contact (e.g., physically contact, electrically contact) the tungsten pad structures 136. In some embodiments, the conductive contact structures 148 are formed to land on the tungsten pad structures 136. As shown in FIG. 1K, the isolation material 147 may substantially cover the staircase structure 110 and the tungsten pad structures 136, and may substantially surround side surfaces (e.g., sidewalls) of the conductive contact structures 148. The isolation material 147 may exhibit a substantially planer upper vertical boundary, and a substantially non-planar lower vertical boundary complementary (e.g., substantially mirroring) to the topography thereunder.

The isolation material 147 may be formed of and include at least one dielectric material, such as one or more of at least one dielectric oxide material (e.g., one or more of SiO$_x$, phosphosilicate glass, borosilicate glass, borophosphosilicate glass, fluorosilicate glass, AlO$_x$, HfO$_x$, NbO$_x$, TiO$_x$, ZrO$_x$, TaO$_x$, and MgO$_x$), at least one dielectric nitride material (e.g., SiN$_y$), at least one dielectric oxynitride material (e.g., SiO$_x$N$_y$), and at least one dielectric carboxynitride material (e.g., SiO$_x$C$_z$N$_y$). The isolation material 147 may include a substantially homogeneous distribution or a substantially heterogeneous distribution of the at least one dielectric material. In some embodiments, the isolation material 147 exhibits a substantially homogeneous distribution of dielectric material. In further embodiments, the isolation material 147 exhibits a substantially heterogeneous distribution of at least one dielectric material. The isolation material 147 may, for example, be formed of and include a stack (e.g., laminate) of at least two different dielectric materials. In some embodiments, the isolation material 147 is formed of and includes SiO$_2$. Optionally, at least one non-oxide dielectric liner material (e.g., a dielectric nitride liner material, such as SiN$_y$) may be formed to intervene between the isolation material 147 and tungsten pad structures 136 and the conductive structures 144 of the stack structure 142. The non-oxide dielectric liner material may, for example, be employed to impede or prevent oxidation of the tungsten pad structures 136 and the conductive structures 144 during the formation of the isolation material 147 (e.g., if the isolation material 147 is formed to comprise a dielectric oxide material, such as SiO$_2$).

The conductive contact structures 148 may be formed of and include at least one electrically conductive material, such as one or more of a metal (e.g., W, Ti, Mo, Nb, V, Hf, Ta, Cr, Zr, Fe, Ru, Os, Co, Rh, Jr, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 148 may have substantially the same material composition, or at least one of the conductive contact structures 148 may have a different material composition than at least one other of the conductive contact structures 148.

The conductive contact structures 148 may each individually be provided at a desired horizontal location (e.g., in the X-direction and in another horizontal direction perpendicular to the X-direction) on or over one of the tungsten pad structures 136. As shown in FIG. 1K, in some embodiments, each of the conductive contact structures 148 is individually substantially horizontally centered on one of the tungsten pad structures 136. For example, the conductive contact structures 148 may be substantially horizontally centered in the X-direction and in another horizontal direction perpendicular to the X-direction (e.g., a Y-direction) on the tungsten pad structures 136. Accordingly, the conductive contact structures 148 may be offset (e.g., in the X-direction) from horizontal centers of portions (e.g., horizontal end portions) of the conductive structure 144 directly vertically underlying (e.g., in the Z-direction) the tungsten pad structures 136 and partially defining the steps 112 of the staircase structure 110. In additional embodiments, one or more of the conductive contact structures 148 are individually horizontally offset (e.g., in the X-direction and/or in another horizontal direction perpendicular to the X-direction) from the horizontal center of the tungsten pad structures 136 associated therewith (e.g., directly vertically thereunder). For example, at least one (e.g., all, less than all) of the conductive contact structures 148 may be horizontally offset in the X-direction from a horizontal center of the tungsten pad structure(s) 136 on which the conductive contact structure(s) 148 is located.

As another example, at least one (e.g., all, less than all) of the conductive contact structures 148 may be horizontally offset in another horizontal direction perpendicular to the X-direction from a horizontal center of the tungsten pad structure(s) 136 on which the conductive contact structure(s) 148 is located.

The isolation material 147 and the conductive contact structures 148 may be formed through conventional processes (e.g., conventional material deposition processes; conventional material removal processes, such as conventional etching processes) and conventional processing equipment, which are not described in detail herein. The tungsten pad structures 136 may impede or prevent undesirable damage to the tiers 146 of the stack structure 142 during the formation of the conductive contact structures 148. For example, the tungsten pad structures 136 may prevent portions of the conductive structures 144 of the stack structure 142 at the steps 112 of the staircase structure 110 from being undesirably damaged (e.g., punched through) during one or more etching processes employed to form openings in the isolation material 147 that are subsequently filled with electrically conductive material to form the conductive contact structures 148.

Thus, in accordance with embodiments of the disclosure, a microelectronic device comprises a stack structure, a staircase structure, conductive pad structures, and conductive contact structures. The stack structure comprises vertically alternating conductive structures and insulating structures arranged in tiers. Each of the tiers individually comprises one of the conductive structures and one of the insulating structures. The staircase structure has steps comprising edges of at least some of the tiers of the stack structure. The conductive pad structures are on the steps of the staircase structure and comprise beta phase tungsten. The conductive contact structures are on the conductive pad structures.

Furthermore, in accordance with embodiments of the disclosure, a method of forming a microelectronic device comprises forming a microelectronic device structure. The microelectronic device structure comprises a stack structure comprising a vertically alternating sequence of insulative structures and additional insulative structures arranged in tiers, and a staircase structure having steps comprising edges of at least some of the tiers of the stack structure. A doped semiconductive liner material is formed on the steps of the staircase structure. Portions of the doped semiconductive liner material are converted into a tungsten liner material. Vertically extending portions of the tungsten liner material are removed to form discrete tungsten pad structures on the steps of the staircase structure. The additional insulative structures of the stack structure are at least partially replaced with conductive structures. Conductive contact structures are formed on the discrete tungsten pad structures.

Figure 2A:
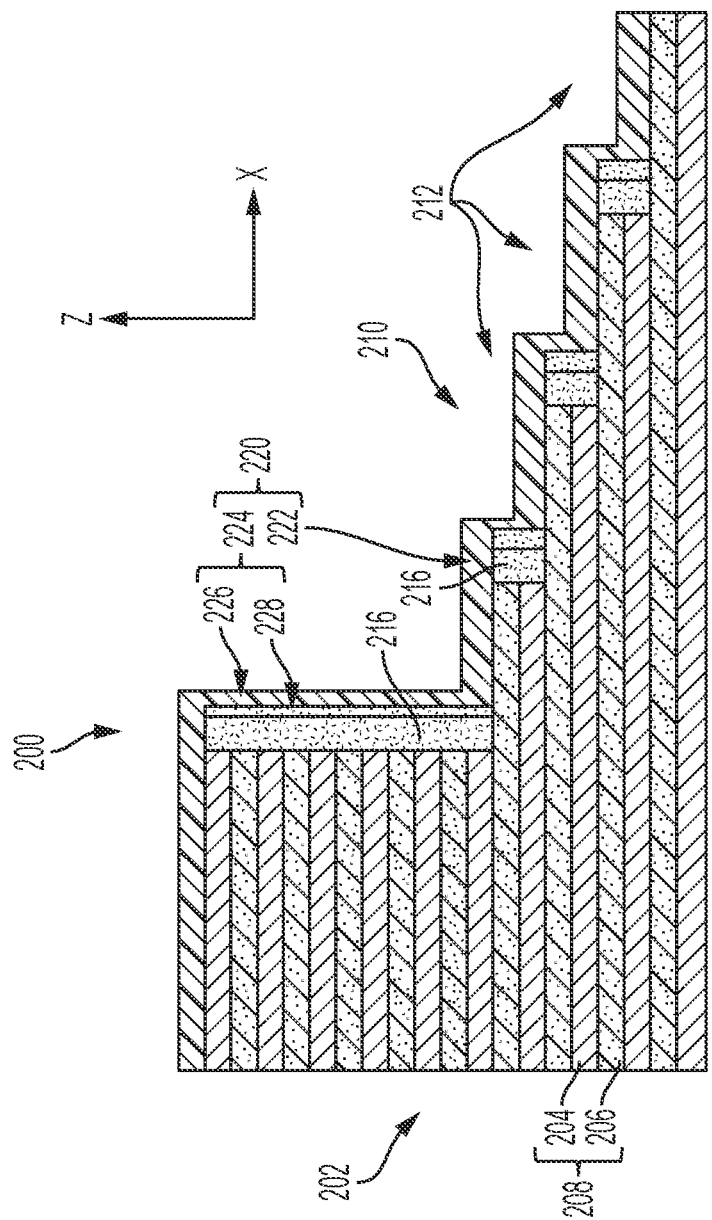
FIGS. 2A through 2C are partial cross-sectional views illustrating a method of forming a microelectronic device, in accordance with additional embodiments of the disclosure.
Figure 2B:
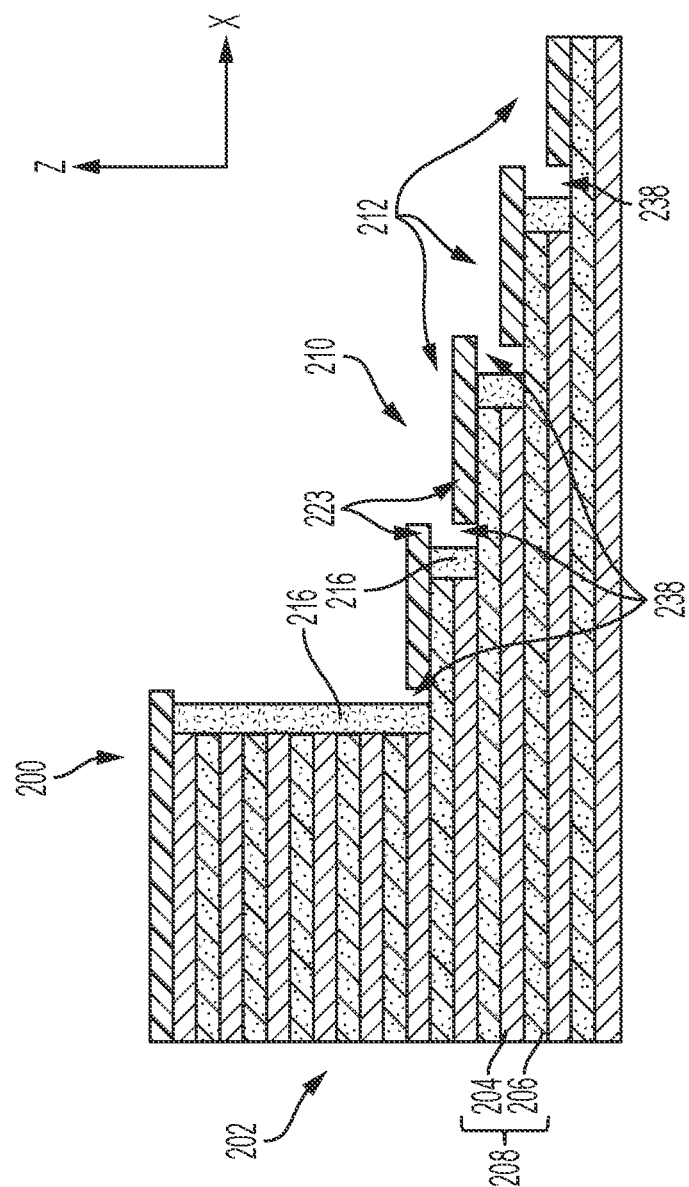
Figure 2C:
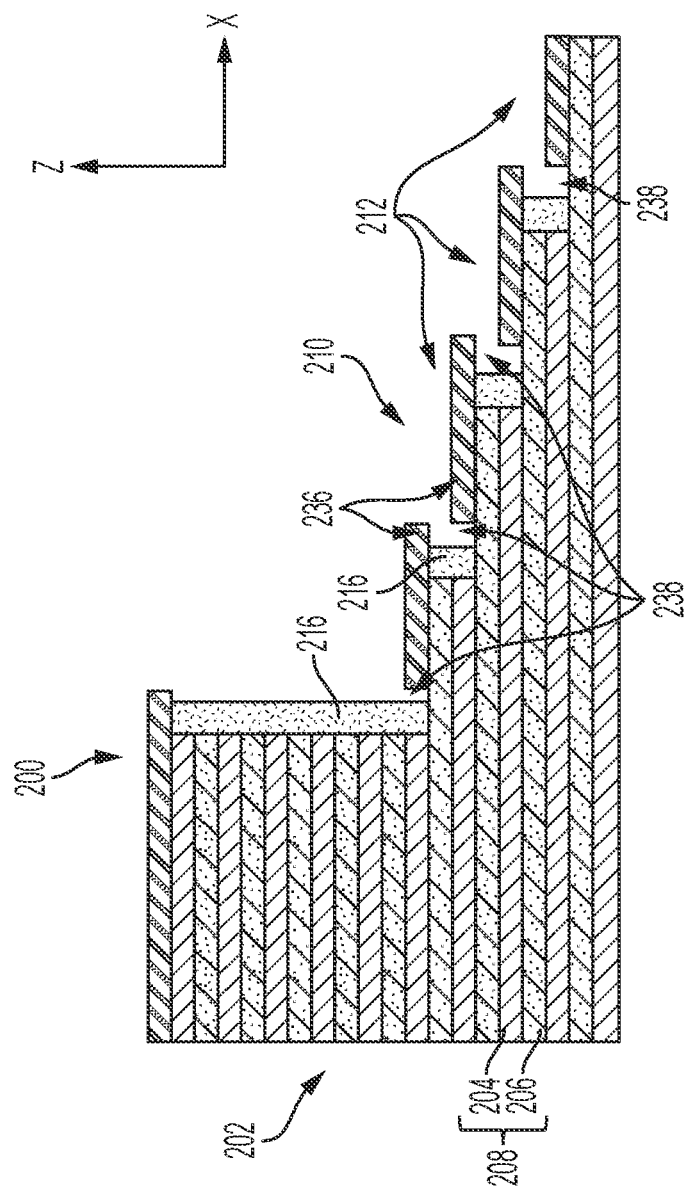

In additional embodiments, different processing acts are employed to form the microelectronic device structure 100 at the processing stage depicted in FIG. 1K. By way of non-limiting example, FIGS. 2A through 2C are simplified partial cross-sectional views illustrating a method of forming a microelectronic device structure 200, in accordance with additional embodiments of the disclosure. The processing acts depicted in FIGS. 2A through 2C and described in further detail below may, for example, be performed in place of the processing acts previously described with reference to FIGS. 1F through 1H (or 1I) to form the microelectronic device structure 100 previously described with reference to FIG. 1K. Throughout FIGS. 2A through 2C and the associated description below, features (e.g., structures, materials, regions) functionally similar to features of the microelectronic device structure 100 previously described with reference to FIGS. 1A through 1K are referred to with similar reference numerals incremented by 100. To avoid repetition, not all features shown in FIGS. 2A through 2C are described in detail herein. Rather, unless described otherwise below, in FIGS. 2A through 2C, a feature designated by a reference numeral that is a 100 increment of the reference numeral of a previously described feature will be understood to be substantially similar to the previously-described feature.

Referring to FIG. 2A, the microelectronic device structure 200 may be formed to include features (e.g., structures, materials) substantially similar to the features (e.g., structures, materials) of the microelectronic device structure 100 up to and including the processing stage previously described with reference to FIG. 1E. For example, the microelectronic device structure 200 may be formed to include a preliminary stack structure 202 including a vertically alternating (e.g., in the Z-direction) sequence of insulative structures 204 and additional insulative structures 206 arranged in tiers 208; a staircase structure 210 having steps 212 defined by edges (e.g., horizontal ends in the X-direction) of the tiers 208; optional dielectric spacer structures 216 at horizontal ends (e.g., in the X-direction) of the steps 212 of the staircase structure 210; and a doped semiconductive liner material 220 on or over surfaces of the insulative structures 204, the additional insulative structures 206, and the dielectric spacer structures 216 (if any) inside of and outside of the boundaries (e.g., vertical boundaries, horizontal boundaries) of the staircase structure 210. The doped semiconductive liner material 220 may include horizontally extending portions 222 and vertically extending portions 224, and the vertically extending portions 224 may include doped regions 226, and substantially undoped regions 228 horizontally adjacent to (e.g., horizontally underlying in the X-direction) the doped regions 226. The preliminary stack structure 202, the insulative structures 204, the additional insulative structures 206, the tiers 208, the staircase structure 210, the steps 212, the dielectric spacer structures 216 (if any), and the doped semiconductive liner material 220 may respectively be substantially similar to and may be formed in substantially the same manner as the preliminary stack structure 102, the insulative structures 104, the additional insulative structures 106, the tiers 108, the staircase structure 110, the steps 112, the dielectric spacer structures 116 (if any), and the doped semiconductive liner material 120 of the microelectronic device structure 100 up to and including the processing stage previously described with reference to FIG. 1E. Accordingly, the method of forming the microelectronic device structure 200 up to and including the processing stage depicted in FIG. 2A incorporates the processing stages and features previously described in relation to the formation of the microelectronic device structure 100 up to and including the processing stage previously described with reference to FIG. 1E.

In addition to being selected to promote subsequent formation of tungsten (e.g., β-phase tungsten) from the semiconductive material (e.g., silicon material) of the doped semiconductive liner material 220, the dopant(s) of the doped semiconductive liner material 220 may be selected to arrest (e.g., impede, slow) removal (e.g., etching) of regions (e.g., the horizontally extending portions 222) of the doped semiconductive liner material 220 having relatively greater amounts of the dopant(s) therein relative to other regions (e.g., the vertically extending portions 224) having relatively smaller amounts of the dopant(s) therein. For example, the dopant(s) may be selected to decease an etch rate of the horizontally extending portions 222 of the doped semiconductive liner material 220 relative to the substantially undoped regions 228 of the vertically extending portions 224 of the doped semiconductive liner material 220. In some embodiments, the dopant(s) of the doped semiconductive liner material 220 comprise B. In additional embodiments, the dopant(s) of the doped semiconductive liner material 220 comprise one or more of P, Ar, Sb, Bi, Al, Ga, C, F, Cl, Br, H, $^2$H, He, Ne, and Ar.

Referring next to FIG. 2B, the vertically extending portions 224 (FIG. 2A) of the doped semiconductive liner material 220 (FIG. 2A) may be substantially removed while maintaining portions of the horizontally extending portions 222 (FIG. 2A) of the doped semiconductive liner material 220 (FIG. 2A) to form semiconductive pad structures 223. The semiconductive pad structures 223 may be separate and discrete from one another. As shown in FIG. 2B, at least some of the semiconductive pad structures 223 may be positioned vertically on portions of the additional insulative structures 206 of the preliminary stack structure 202 at the steps 212 of the staircase structure 210. The at least some of the semiconductive pad structures 223 may also be positioned vertically on portions of the dielectric spacer structures 216 (if any) at the steps 212 of the staircase structure 210. As shown in FIG. 2B, one or more additional semiconductive pad structures 223 may be positioned on or over surfaces of the preliminary stack structure 202 outside of the boundaries (e.g., horizontal boundaries, vertical boundaries) of the staircase structure 210.

Thicknesses (e.g., in the Z-direction) of the semiconductive pad structures 223 may be less than or equal to thicknesses of the horizontally extending portions 222 (FIG. 2A) of the doped semiconductive liner material 220 (FIG. 2A). In some embodiments, the material removal process employed to substantially remove the vertically extending portions 224 (FIG. 2A) of the doped semiconductive liner material 220 (FIG. 2A) also partially removes the horizontally extending portions 222 (FIG. 2A) of the doped semiconductive liner material 220 (FIG. 2A), such that a thickness of each of the semiconductive pad structures 223 is less than (e.g., thinner than) a thickness of the horizontally extending portion 222 (FIG. 2A) of the doped semiconductive liner material 220 (FIG. 2A) from which the semiconductive pad structure 223 was formed. In some embodiments, each of the semiconductive pad structures 223 individually has a thickness within a range of from about 10 percent to about 70 percent (e.g., from about 30 percent to about 70 percent, from about 40 percent to about 60 percent) of a thickness of the horizontally extending portion 222 (FIG. 2A) of the doped semiconductive liner material 220 (FIG. 2A) from which the semiconductive pad structure 223 was formed.

As shown in FIG. 1H, the removal of the vertically extending portions 224 (FIG. 2A) of the doped semiconductive liner material 220 (FIG. 2A) forms air gaps 238 intervening between neighboring semiconductive pad structures 223. The air gaps 238 may each individually vertically extend (e.g., in the Z-direction) from a lower vertical boundary (e.g., a lower surface) of a relatively vertically higher semiconductive pad structure 223 to a lower vertical boundary (e.g., a lower surface) of a relatively vertically lower semiconductive pad structure 223 horizontally neighboring the relatively vertically higher semiconductive pad structure 223. In addition, the air gaps 238 may each individually horizontally extend (e.g., in the X-direction) from a horizontal boundary (e.g., a side surface) of one of the semiconductive pad structures 223 to a horizontal boundary of at least one other structure (e.g., dielectric spacer structure 216 (if any), insulative structure 204, additional insulative structure 206) of the microelectronic device structure 200 horizontally neighboring the semiconductive pad structure 223.

The vertically extending portions 224 (FIG. 2A) of the doped semiconductive liner material 220 (FIG. 2A) may be removed by treating the microelectronic device structure 200 with at least one etchant (e.g., wet etchant) formulated to remove the doped semiconductive liner material 220 (FIG. 2A) without substantially removing exposed portions of the dielectric spacer structures 216 (if any), the insulative structures 204, and additional insulative structures 206. The at least one etchant may remove the substantially undoped regions 228 (FIG. 2A) of the vertically extending portions 224 (FIG. 2A) of the doped semiconductive liner material 220 (FIG. 2A) faster than the horizontally extending portions 222 (FIG. 2A) of the doped semiconductive liner material 220 (FIG. 2A). By way of non-limiting example, the etchant may comprise one or more of HF, a BOE, and $HNO_3$. In some embodiments, the etchant comprises a solution including water and HF at a ratio within a range of from about 500:1 to about 100:1. The material removal process may selectively remove the vertically extending portions 224 (FIG. 2A) of the doped semiconductive liner material 220 (FIG. 2A), and may also clean and rinse exposed surfaces of the preliminary stack structure 202, the dielectric spacer structure 216 (if any), and the semiconductive pad structures 223. In some embodiments, the material removal process includes treating the microelectronic device structure 200 with an aqueous HF solution, followed by treatment with TMAH.

Referring next to FIG. 2C, the semiconductive pad structures 223 (FIG. 2B) may be converted into tungsten pad structures 236. The conversion process may convert portions of the semiconductive material (e.g., silicon material, such as polycrystalline silicon) of the semiconductive pad structures 223 (FIG. 2B) into tungsten. The tungsten pad structures 236 may be substantially similar to the tungsten pad structures 136 previously described with reference to FIG. 1H. For example, at least some of the tungsten of tungsten pad structures 236 may comprise β-phase tungsten. Tungsten included within the tungsten pad structures 236 may only be present in the β-phase, or may be present in the β-phase and in the α-phase. If the tungsten pad structures 236 include β-phase tungsten and α-phase tungsten, an amount of β-phase tungsten included in the tungsten pad structures 236 may be different than an amount of α-phase tungsten included in the tungsten pad structures 236, or may be substantially the same as amount of α-phase tungsten included in the tungsten pad structures 236. In some embodiments, an amount of β-phase tungsten included in the tungsten pad structures 236 is greater than an amount of α-phase tungsten included in the tungsten pad structures 236. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the tungsten pad structures 236 may be present in the β-phase.

The tungsten pad structures 236 may be formed by treating the semiconductive pad structures 223 (FIG. 2B) with one or more chemical species facilitating the conversion of the semiconductive material (e.g., silicon material) thereof into tungsten (e.g., β-phase tungsten, α-phase tungsten). By way of non-limiting example, if the semiconductive pad structures 223 (FIG. 2B) comprise a doped silicon material, such as doped polycrystalline silicon, the semiconductive pad structures 223 (FIG. 2B) may be treated with $WF_6$ to form the tungsten pad structures 236. Silicon (Si) of the semiconductive pad structures 223 (FIG. 2B) may react with the $WF_6$ to produce tungsten and $SiF_4$. The produced $SiF_4$ is removed as a gas. The produced tungsten remains with the dopant(s) of the semiconductive pad structures 223 (FIG. 2B) to form the tungsten pad structures 236. The semiconductive pad structures 223 (FIG. 2B) may, for example, be treated with $WF_6$ using a conventional CVD apparatus at a temperature within a range of from about 200° C. to about 500° C.

Following the formation of the tungsten pad structures 236, the microelectronic device structure 200 may be subjected to additional processing. For example, the microelectronic device structure 200 may be subjected to the additional processing acts previously described with reference to FIGS. 1J and 1K to form a configuration of the microelectronic device structure 200 substantially the same as the configuration of the microelectronic device structure 100 previously described with reference to FIG. 1K. Accordingly, the method of forming the microelectronic device structure 200 following the processing stage depicted in FIG. 2C incorporates the processing stages and features previously described in relation to the formation of the microelectronic device structure 100 up to and including the processing stage previously described with reference to FIG. 1K.

Thus, in accordance with embodiments of the disclosure, a method of forming a microelectronic device comprises forming a microelectronic device structure. The microelectronic device structure comprises a stack structure comprising a vertically alternating sequence of insulative structures and additional insulative structures arranged in tiers, and a staircase structure having steps comprising edges of at least some of the tiers of the stack structure. A doped semiconductive liner material is formed over and in contact with at least some of the additional insulative structures of the stack structure at the steps of the staircase structure. Vertically extending portions of the doped semiconductive liner material are removed to form discrete semiconductive pad structures over the steps of the staircase structure. The discrete semiconductive pad structures are converted into discrete conductive pad structures. At least some portions of the additional insulative structures of the stack structure are replaced with conductive structures. Conductive contact structures are formed on the discrete conductive pad structures.

Figure 3:
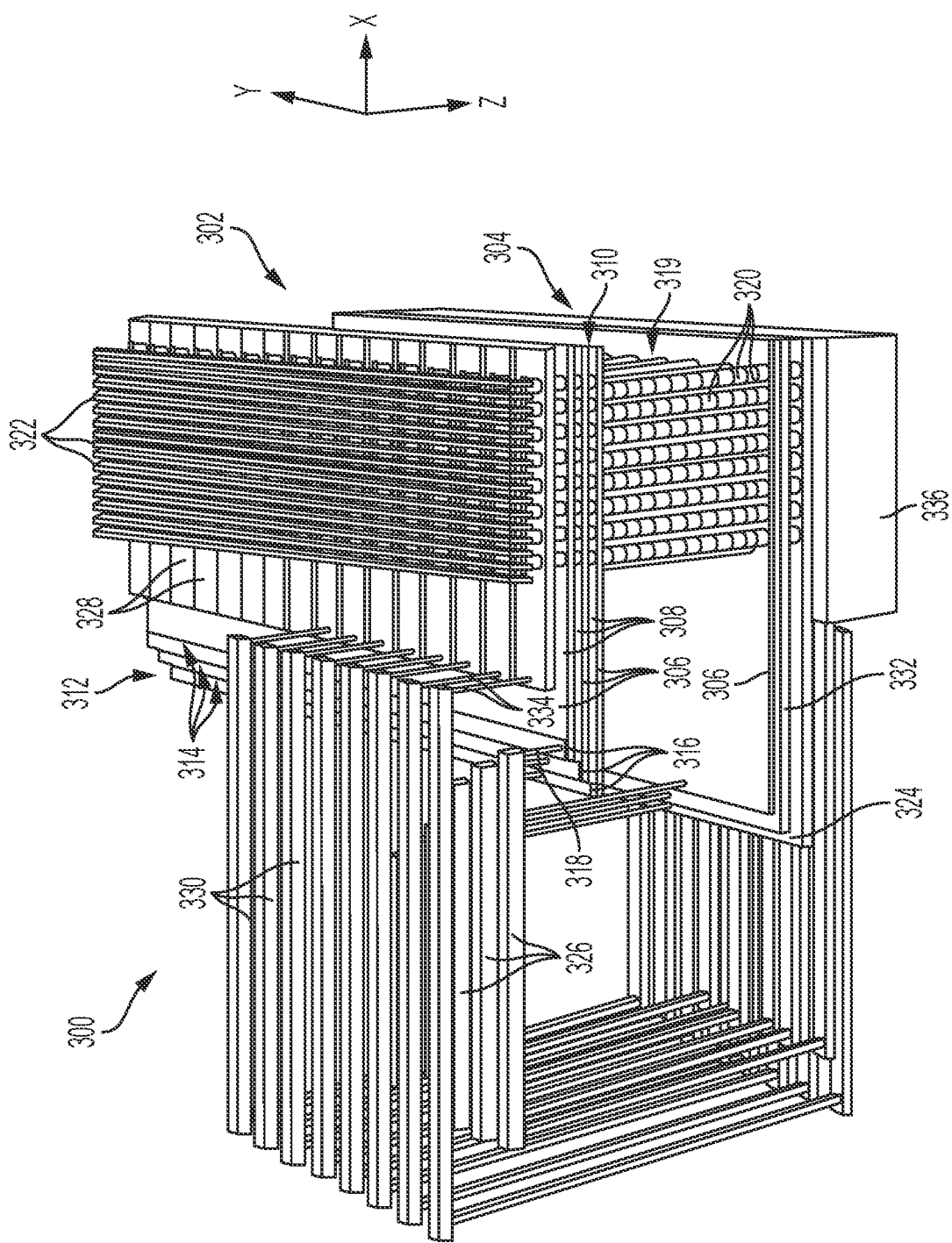
FIG. 3 is a partial cutaway perspective view of a microelectronic device, in accordance with embodiments of the disclosure.

FIG. 3 illustrates a partial cutaway perspective view of a portion of a microelectronic device 300 (e.g., a memory device, such as a 3D NAND Flash memory device) including a microelectronic device structure 302. The microelectronic device structure 302 may be substantially similar to the microelectronic device structure 100 at the processing stage previously described with reference to FIG. 1K. In some embodiments, the microelectronic device structure 302 is formed through the processes previously described with reference to FIGS. 1A through 1K. In additional embodiments, the microelectronic device structure 302 is formed through the processes previously described with reference FIGS. 2A through 2C. As shown in FIG. 3, the microelectronic device structure 302 may include a stack structure 304 including a vertically alternating (e.g., in the Z-direction) sequence of conductive structures 306 and insulative structures 308 arranged in tiers 310; a staircase structure 312 having steps 314 defined by edges (e.g., horizontal ends in the X-direction) of the tiers 310; tungsten pad structures 316 on portions of the conductive structures 306 at the steps 314 of the staircase structure 312; and conductive contact structures 318 connected (e.g., physically connected, electrically connected) to the tungsten pad structures 316. The stack structure 304, the conductive structures 306, the insulative structures 308, the tiers 310, the staircase structure 312, the steps 314, the tungsten pad structures 316, and the conductive contact structures 318 may respectively be substantially similar to the stack structure 142, the conductive structures 144, the insulative structures 104, the tiers 146, the staircase structure 110, the steps 112, the tungsten pad structures 136, and the conductive contact structures 148 previously described with reference to FIG. 1K. The microelectronic device 300 also includes additional features (e.g., structures, devices) operatively associated with the microelectronic device structure 302, as described in further detail below.

The microelectronic device 300 may further include vertical strings 319 of memory cells 320 coupled to each other in series, data lines 322 (e.g., bit lines), a source structure 324, access lines 326, first select gates 328 (e.g., upper select gates, drain select gates (SGDs)), select lines 330, second select gates 332 (e.g., lower select gates, source select gate (SGSs)), and additional contact structures 334. The vertical strings 319 of memory cells 320 extend vertically and orthogonal to conductive lines and tiers (e.g., the data lines 322, the source structure 324, the tiers 310 of the stack structure 304, the access lines 326, the first select gates 328, the select lines 330, the second select gates 332). The conductive contact structures 318 and the additional contact structures 334 may electrically couple components to each other as shown (e.g., the select lines 330 to the first select gates 328, the access lines 326 to the tiers 310 of the stack structure 304 of the microelectronic device structure 302).

With continued reference to FIG. 3, the microelectronic device 300 may also include a control unit 336 (e.g., a control device) positioned vertically below the vertical strings 319 of memory cells 320, which may include one or more of string driver circuitry, pass gates, circuitry for selecting gates, circuitry for selecting conductive lines (e.g., the access lines 326, the select lines 330, the data lines 322, additional access lines, additional select lines, additional data lines), circuitry for amplifying signals, and circuitry for sensing signals. In some embodiments, the control unit 336 is at least partially (e.g., substantially) positioned within horizontal boundaries (e.g., in the X-direction and the Y-direction) of a horizontal area occupied by the vertical strings 319 of memory cells 320. The control unit 336 may, for example, be electrically coupled to the data lines 322, the source structure 324, the access lines 326, and select lines 330. In some embodiments, the control unit 336 includes CMOS (complementary metal-oxide-semiconductor) circuitry. In such embodiments, the control unit 336 may be characterized as having a "CMOS under Array" ("CuA") configuration.

Thus, in accordance with embodiments of the disclosure, a microelectronic device comprises a stack structure, a staircase structure, conductive pad structures, conductive contact structures, data line structures, a source structure, an array of vertically extending strings of memory cells, access line structures, and a control device. The stack structure comprises vertically alternating conductive structures and insulating structures arranged in tiers. Each of the tiers individually comprises at least one of the conductive structures and at least one of the insulating structures. The staircase structure has steps comprising edges of at least some of the tiers of the stack structure. The conductive pad structures comprise beta phase tungsten on the steps of the staircase structure. The conductive contact structures are on the conductive pad structures. The data line structures overlie the stack structure. The source structure underlies the stack structure. The vertically extending strings of memory cells extend through the stack structure and are electrically connected to the source structure and the data line structures. The access line structures are electrically connected to the conductive contact structures. The control device vertically underlies the source structure and is within horizontal boundaries of the array of vertically extending strings of memory cells. The control device is electrically coupled to the source structure, the data line structures, and the access line structures.

Figure 4:
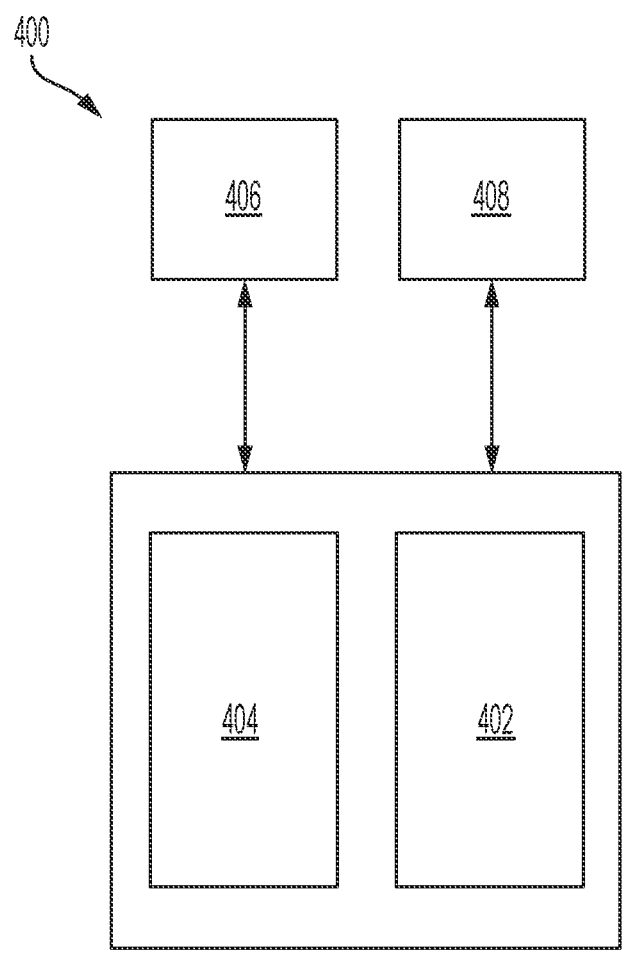
FIG. 4 is a schematic block diagram illustrating an electronic system, in accordance with embodiments of the disclosure.

Microelectronic device structures (e.g., the microelectronic device structure 100 previously described with reference to FIG. 1K) and microelectronic devices (e.g., the microelectronic device 300 previously described with reference to FIG. 3) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure and a microelectronic device previously described herein. The electronic system 400 may further include at least one electronic signal processor device 404 (often referred to as a "microprocessor"). The electronic signal processor device 404 may, optionally, include an embodiment of one or more of a microelectronic device structure and a microelectronic device previously described herein. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure and a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises a microelectronic device structure comprising a stack structure, a staircase structure, conductive pad structures, and conductive contact structures. The stack structure comprises tiers each comprising a conductive structure comprising alpha phase tungsten, and an insulative structure vertically neighboring the conductive structure and comprising a dielectric oxide material. The staircase structure is within the stack structure and has steps comprising edges of at least some of the tiers. The conductive pad structures are on at least some of the steps of the staircase structure and comprise beta phase tungsten. The conductive contact structures are on the conductive pad structures.

The methods, structures (e.g., the microelectronic device structures 100, 200, 302), devices (e.g., the microelectronic device 300), and systems (e.g., the electronic system 400) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may alleviate problems related to the formation and processing of conventional microelectronic devices including stack structures having staircase structures at edges thereof. For example, the methods and structures of the disclosure may reduce the risk of undesirable damage (e.g., contact structure punch through) to conductive structures (e.g., the conductive structures 144, 244, 306) of the stack structures (e.g., the stack structures 142, 242, 304) at steps (e.g., the steps 112, 212, 314) of the staircase structures (e.g., the staircase structures 110, 210, 312), as well as undesirable current leakage and short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
 a stack structure comprising tiers each comprising:
  conductive material comprising alpha phase tungsten; and
  insulative material vertically neighboring the conductive material;
 a staircase structure having steps comprising horizontal ends of at least some of the tiers of the stack structure;
 tungsten pad structures on the steps of the staircase structure, at least a majority of each of the tungsten pad structures comprising beta phase tungsten and each of the tungsten pad structures having a horizontal center that is horizontally offset from a horizontal center of one of the steps directly vertically thereunder; and
 conductive contact structures on the tungsten pad structures.

2. The microelectronic device of claim 1, further comprising dielectric spacer structures on the steps of the staircase structure, the dielectric spacer structures horizontally interposed between the tungsten pad structures and the steps of the staircase structure.

3. The microelectronic device of claim 2, wherein the tungsten pad structures directly physically contact upper surfaces of the steps of the staircase structure and upper surfaces of the dielectric spacer structures.

4. The microelectronic device of claim 3, wherein the upper surfaces of the steps of the staircase structure are substantially coplanar with the upper surfaces of the dielectric spacer structures.

5. The microelectronic device of claim 2, further comprising insulative fill material on surfaces of the steps of the staircase structure, the dielectric spacer structures, the tungsten pad structures, and the conductive contact structures.

6. The microelectronic device of claim 5, wherein portions of the insulative fill material are horizontally interposed between the tungsten pad structures and the dielectric spacer structures.

7. The microelectronic device of claim 6, wherein upper boundaries of the insulative fill material are vertically positioned at or above upper boundaries of the stack structure.

8. The microelectronic device of claim 1, wherein each of the tungsten pad structures horizontally extends past horizontal boundaries of the one of the steps of the staircase structure directly vertically thereunder.

9. The microelectronic device of claim 1, wherein horizontal centers of the conductive contact structures are substantially horizontally aligned with horizontal centers of the tungsten pad structures directly vertically thereunder.

10. A memory device, comprising:
a stack structure comprising tiers each comprising alpha phase tungsten material and insulative material vertically neighboring the alpha phase tungsten material;
strings of memory cells vertically extending through the tiers of the stack structure;
a staircase structure horizontally offset from an array of the strings of memory cells and having steps comprising edges of at least some of the tiers of the stack structure;
beta phase tungsten pad structures directly physically contacting the steps of the staircase structure, each of the beta phase tungsten pad structures having a horizontal center spaced apart from a horizontal center of one of the steps directly vertically thereunder; and
conductive contacts directly physically contacting the beta phase tungsten pad structures;
access lines coupled to the conductive contacts;
data lines vertically offset from the stack structure and coupled to the strings of memory cells;
a source structure offset from the stack structure and the data lines and coupled to the strings of memory cells; and
complementary metal-oxide-semiconductor (CMOS) circuitry within a horizontal area of the array of the strings of memory cells and vertically offset from the stack structure, the data lines, and the source structure.

11. The memory device of claim 10, further comprising:
dielectric spacer structures directly physically contacting the steps of the staircase structure, each of the dielectric spacer structures horizontally interposed between one of the beta phase tungsten pad structures and one of the steps of the staircase structure and vertically interposed between an addition one of the beta phase tungsten pad structures and an additional one of the steps of the staircase structure; and
insulative fill material directly physically contacting the steps of the staircase structure, the dielectric spacer structures, the beta phase tungsten pad structures, and the conductive contacts.

12. The memory device of claim 11, wherein the insulative fill material directly physically contacts upper surfaces of the alpha phase tungsten material, side surfaces of the dielectric spacer structures, upper surfaces and side surfaces of the beta phase tungsten pad structures, and side surfaces of the conductive contacts.

13. The memory device of claim 12, wherein portions of the insulative fill material horizontally extend from and between the side surfaces of the dielectric spacer structures and the side surfaces of the beta phase tungsten pad structures.

14. The memory device of claim 10, wherein horizontal centers of the conductive contacts are spaced apart from horizontal centers of the steps of the staircase structure most proximate thereto.

15. The memory device of claim 14, wherein the horizontal centers of the conductive contacts are substantially aligned with horizontal centers of the beta phase tungsten pad structures in direct physical contact therewith.

16. The memory device of claim 10, wherein each of the beta phase tungsten pad structures horizontally extends across portions of two of the steps horizontally neighboring one another.

17. The memory device of claim 10, wherein each of the beta phase tungsten pad structures comprises beta phase tungsten and one or more of phosphorus, arsenic, antimony, bismuth, boron, aluminum, gallium, carbon, fluorine, chlorine, bromine, and argon.

18. An electronic system, comprising:
a processor device operably coupled to an input device and an output device; and
a memory device operably coupled to the processor device and comprising:
a stack structure comprising tiers each comprising:
conductive material comprising alpha phase tungsten; and
insulative material vertically neighboring the conductive material;
a staircase structure having steps comprising edges of at least some of the tiers of the stack structure;
tungsten pad structures on at least some of the steps of the staircase structure and individually comprising a lower concentration of the alpha phase tungsten than the conductive material of the tiers of the stack structure, at least one of the tungsten pad structures having a horizontal center offset from a horizontal center of one of the steps directly vertically thereunder; and
conductive contact structures on the tungsten pad structures.

19. The electronic system of claim 18, wherein the memory device comprises a 3D NAND Flash memory device.

* * * * *

UNITED STATES PATENT AND TRADEMARK OFFICE
CERTIFICATE OF CORRECTION

PATENT NO. : 11,894,305 B2
APPLICATION NO. : 17/658907
DATED : February 6, 2024
INVENTOR(S) : Greenlee et al.

It is certified that error appears in the above-identified patent and that said Letters Patent is hereby corrected as shown below:

In the Specification

| | | |
|---|---|---|
| Column 10, | Line 52, | change "(e.g., (3-phase tungsten)" to --(e.g., β-phase tungsten)-- |
| Column 16, | Lines 66-67, | change "iridium (Jr), iridium" to --iridium (Ir), iridium-- |
| Column 18, | Line 25, | change "Co, Rh, Jr, Ni, Pa," to --Co, Rh, Ir, Ni, Pa,-- |

Signed and Sealed this
Second Day of April, 2024

Katherine Kelly Vidal
*Director of the United States Patent and Trademark Office*